United States Patent
Kim et al.

(10) Patent No.: US 10,461,392 B2
(45) Date of Patent: Oct. 29, 2019

(54) BIDIRECTIONAL COUPLER, MONITOR CIRCUIT, AND FRONT END CIRCUIT

(71) Applicant: Murata Manufacturing Co., Ltd., Kyoto (JP)

(72) Inventors: Ryangsu Kim, Kyoto (JP); Yasushi Shigeno, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/994,741

(22) Filed: May 31, 2018

(65) Prior Publication Data

US 2018/0351228 A1 Dec. 6, 2018

(30) Foreign Application Priority Data

Jun. 1, 2017 (JP) ................................. 2017-109541
Feb. 26, 2018 (JP) ................................. 2018-032164

(51) Int. Cl.
| H01P 5/18 | (2006.01) |
| H04B 3/52 | (2006.01) |
| H04B 1/00 | (2006.01) |
| H03H 9/70 | (2006.01) |
| H01P 5/19 | (2006.01) |

(52) U.S. Cl.
CPC ............... *H01P 5/18* (2013.01); *H01P 5/185* (2013.01); *H03H 9/70* (2013.01); *H04B 1/0057* (2013.01); *H04B 3/52* (2013.01)

(58) Field of Classification Search
CPC ............... H01P 5/18; H01P 5/184; H01P 5/19
USPC .............................. 333/109, 116, 117
See application file for complete search history.

(56) References Cited

U.S. PATENT DOCUMENTS

| 6,515,556 | B1 * | 2/2003 | Kato | H01P 5/10 333/116 |
| 8,629,736 | B2 * | 1/2014 | Tamaru | H01P 5/18 333/109 |
| 9,035,718 | B2 * | 5/2015 | Tamaru | H01P 5/18 333/109 |
| 9,077,061 | B2 * | 7/2015 | Tamaru | H01P 5/184 |
| 9,570,793 | B2 * | 2/2017 | Borodulin | H01P 5/185 |
| 9,647,314 | B1 * | 5/2017 | Nguyen | H01P 5/18 |
| 9,673,504 | B2 * | 6/2017 | Meharry | H01P 5/187 |
| 9,748,627 | B2 * | 8/2017 | Sun | H01P 5/18 |
| 9,838,055 | B2 * | 12/2017 | Mitake | H01P 5/184 |

FOREIGN PATENT DOCUMENTS

JP 2002-100909 4/2002

* cited by examiner

*Primary Examiner* — Dean O Takaoka
(74) *Attorney, Agent, or Firm* — Pearne & Gordon LLP

(57) ABSTRACT

A bidirectional coupler includes a multilayer board, a first main line, a second main line, a third main line, and an sub line. The sub line includes a first line portion, an even number of second line portions, and an even number of third line portions. One half of the second line portions is provided between the first line portion and one end of the sub line. The other half of the second line portions is provided between the first line portion and the other end of the sub line. One half of the third line portions is provided between the one half of the second line portions and the one end of the sub line. The other half of the third line portions is provided between the other half of the second line portions and the other end of the sub line.

20 Claims, 17 Drawing Sheets

BIDIRECTIONAL COUPLER, MONITOR CIRCUIT, AND FRONT END CIRCUIT

This application claims priority from Japanese Patent Application No. 2018-032164 filed on Feb. 26, 2018, which claims priority from Japanese Patent Application No. 2017-109541 filed on Jun. 1, 2017. The content of this application is incorporated herein by reference in its entirety.

BACKGROUND

The present disclosure relates to bidirectional couplers, monitor circuits, and front end circuits.

To date, directional couplers that process a plurality of high-frequency signals different in frequency band have been known (see for example, Japanese Unexamined Patent Application Publication No. 2002-100909).

FIG. 18 is a perspective view that illustrates an example of a configuration of the directional coupler disclosed in Japanese Unexamined Patent Application Publication No. 2002-100909. The names of the constituent elements and the references used hereinafter may be different from those in Japanese Unexamined Patent Application Publication No. 2002-100909 for convenience of explanation.

The directional coupler 9 in FIG. 18 includes a first main line 91, a second main line 92, a first sub line 93, a second sub line 94, and a ground 96.

The first main line 91 and the second main line 92 are arranged with the ground 96 interposed therebetween. The first sub line 93 and the second sub line 94 are arranged with the ground 96 interposed therebetween and are coupled to the first main line 91 and the second main line 92, respectively. The first sub line 93 and the second sub line 94 form a single sub line 95 by their respective one ends being connected.

One end and the other end of the first main line 91 constitute an input port P1 and an output port P2 while one end and the other end of the second main line 92 constitute an input port P3 and an output port P4. One end and the other end of the sub line 95 constitute a coupling port P5 and an isolation port P6.

For example, the directional coupler 9 is provided in a mobile phone terminal adaptable to a dual band, where two transmission signals different in frequency band are processed and is used so as to monitor intensities of the transmission signals.

Specifically, one and the other of the two transmission signals are supplied to the input ports P1 and P3, respectively, and propagate through the first main line 91 and the second main line 92 to be supplied to an antenna from the output ports P2 and P4. A first monitor signal corresponding to the intensities of the transmission signals is extracted from the coupling port P5. The first monitor signal is used for feedback control of transmission electric power for example.

BRIEF SUMMARY

In recent years, a directional coupler has been demanded to be a bidirectional coupler, which monitors both a forward direction signal and a reverse direction signal. Herein, a forward direction signal indicates a signal that propagates through a main line from an input port to an output port and a reverse direction signal indicates a signal that propagates through a main line from an output port to an input port.

A basic configuration of a bidirectional coupler is the same as the configuration of a four-port directional coupler. Thus, although it is not mentioned in Japanese Unexamined Patent Application Publication No. 2002-100909, even in the directional coupler 9, a second monitor signal corresponding to the intensities of reverse direction signals that propagate through the first main line 91 and the second main line 92, such as reflected waves from the antenna, can be extracted from the isolation port P6.

When the directional coupler 9 is used as a bidirectional coupler, however, the directivity of the directional coupler 9 relative to a forward direction signal and the directivity of the directional coupler 9 relative to a reverse direction signal differ from each other. Accordingly, a problem rises that when the directional coupler 9 is used as a bidirectional coupler, the directivity relative to a forward direction signal and the directivity relative to a reverse direction signal fail to match and the directivity of a forward direction signal and the directivity of a reverse direction signal are inequivalent.

Accordingly, the present disclosure is aimed at providing a bidirectional coupler that is capable of monitoring forward direction signals and reverse direction signals in each of three signal lines and is favorable in both the directivity relative to a forward direction signal and the directivity relative to a reverse direction signal.

To achieve the above-described aim, a bidirectional coupler according to embodiments of the present disclosure includes a multilayer board; and a first main line, a second main line, a third main line, and a sub line that are provided in or on the multilayer board, the sub line comprising a first line portion that is electromagnetically coupled to the first main line, an even number of second line portions that are electromagnetically coupled to the second main line, and an even number of third line portions that are electromagnetically coupled to the third main line, a first half of the even number of second line portions being provided between the first line portion and a first end of the sub line, and a second half of the even number of second line portions being provided between the first line portion and a second end of the sub line, a first half of the even number of third line portions being provided between the first half of the second line portions and the first end of the sub line, and a second half of the even number of third line portions being provided between the second half of the second line portions and the second end of the sub line.

According to this configuration, on both sides of the first line portion of the sub line, which constitute a portion coupled to the first main line, the second line portions, which constitute a portion coupled to the second main line, are arranged to be identical in number. Thus, in the sub line, with the portion coupled to the first main line positioned in the center, the portion coupled to the second main line can be arranged symmetrically. Further, on both sides of the second line portion, which constitute a portion coupled to the second main line, the third line portions, which constitute a portion coupled to the third main line, are arranged to be identical in number. Thus, in the sub line, with the portion coupled to the second main line positioned in the center, the portion coupled to the third main line can be arranged symmetrically. By arranging the coupled portions as described above, electrical characteristics from the first main line to the first end and the second end of the sub line can be matched, electrical characteristics from the second main line to the first end and the second end of the sub line can be substantially equalized, and electrical characteristics from the third main line to the first end and the second end of the sub line can be substantially equalized.

Accordingly, both the directivity of a first monitor signal corresponding to a forward direction signal and the directivity of a second monitor signal corresponding to a reverse direction signal can be enhanced. As a result, the bidirectional coupler can be obtained, where both the directivity relative to a forward direction signal and the directivity relative to a reverse direction signal are improved.

The first line portion may comprise a pair of first line portions.

According to this configuration, the first line portions can be arranged by being divided and thus, flexibility in layout of the sub lines can be increased.

The electrical length between the mid-point of the sub line and one of the pair of first line portions is approximately equal to the electrical length between the mid-point and the other of the pair of first line portions.

According to this configuration, the portions of the sub line coupled to the first main line are arranged at symmetrical positions in the sub line based on the electrical length and thus, electrical characteristics from the first main line to the first end and the second end of the sub line can be substantially equalized more accurately. As a result, the bidirectional coupler can be obtained, where both the directivity relative to a forward direction signal and the directivity relative to a reverse direction signal are enhanced.

The even number of second line portions may comprise a pair of second line portions, and the electrical length between a mid-point of the sub line and one of the pair of second line portions is approximately equal to the electrical length between the mid-point and the other of the pair of second line portions.

According to this configuration, the portions of the sub line coupled to the second main line are arranged at symmetrical positions in the sub line based on the electrical length and thus, electrical characteristics from the second main line to the first end and the second end of the sub line can be substantially equalized more accurately. As a result, the bidirectional coupler can be obtained, where both the directivity relative to a forward direction signal and the directivity relative to a reverse direction signal are enhanced.

The even number of third line portions may comprise a pair of third line portions, and the electrical length between a mid-point of the sub line and one of the pair of third line portions is approximately equal to the electrical length between the mid-point and the other of the pair of third line portions.

According to this configuration, the portions of the sub line coupled to the third main line are arranged at symmetrical positions in the sub line based on the electrical length and thus, electrical characteristics from the third main line to the first end and the second end of the sub line can be substantially equalized more accurately. As a result, the bidirectional coupler can be obtained, where both the directivity relative to a forward direction signal and the directivity relative to a reverse direction signal are enhanced.

The even number of second line portions may comprise a pair of second line portions, and the sub line is arranged in or on the multilayer board in line symmetry with a line of symmetry passing through the multilayer board in a plan view, each of the pair of second line portions being arranged on opposite sides of the line of symmetry and at corresponding symmetrical positions about the line of symmetry.

According to this configuration, on the basis of the shape of the sub line that is symmetric, electrical characteristics from the second main line to the first end and the second end of the sub line can be substantially equalized more accurately. As a result, the bidirectional coupler can be obtained, where both the directivity relative to a forward direction signal and the directivity relative to a reverse direction signal are enhanced.

The even number of third line portions may comprise a pair of third line portions, and the sub line is arranged in or on the multilayer board in line symmetry with a line of symmetry passing through the multilayer board in a plan view, each of the pair of second line portions being arranged on opposite sides of the line of symmetry and at corresponding symmetrical positions about the line of symmetry.

According to this configuration, on the basis of the shape of the sub line that is symmetric, electrical characteristics from the third main line to the first end and the second end of the sub line can be substantially equalized more accurately. As a result, the bidirectional coupler can be obtained, where both the directivity relative to a forward direction signal and the directivity relative to a reverse direction signal are enhanced.

The sub line is arranged in or on the multilayer board in line symmetry with a line of symmetry passing through the multilayer board in a plan view, each of the pair of second line portions being arranged on opposite sides of the line of symmetry and at corresponding symmetrical positions about the line of symmetry.

According to this configuration, on the basis of the shape of the sub line that is symmetric, electrical characteristics from the first main line to the first end and the second end of the sub line can be substantially equalized more accurately. As a result, the bidirectional coupler can be obtained, where both the directivity relative to a forward direction signal and the directivity relative to a reverse direction signal are enhanced.

Each of the pair of first line portions may be connected to each other by an inductor.

According to this configuration, the inductor can be inserted in series at the mid-point of the sub line and thus, the directivity of the bidirectional coupler can be increased.

A width of at least one of the first line portion, the second line portion, and the third line portion may be different from a width of another of the first line portion, the second line portion, and the third line portion.

According to this configuration, coupling of the sub line to each of the first main line, the second main line, and the third main line can be optimized according to the width of the sub line.

A monitor circuit according to embodiments of the present disclosure includes the bidirectional coupler.

According to this configuration, a monitor circuit can be obtained, which monitors both a forward direction signal and a reverse direction signal using a bidirectional coupler increased in both the directivity relative to a forward direction signal and the directivity relative to a reverse direction signal.

A front end circuit according to embodiments of the present disclosure includes the monitor circuit, an antenna terminal connected to the monitor circuit, and a filter connected to the monitor circuit.

According to this configuration, the use of a monitor circuit with a bidirectional coupler increased in both the directivity relative to a forward direction signal and the directivity relative to a reverse direction signal can bring a high-performance communication device that performs various kinds of control with high accuracy including feedback control of transmission power and matching adjustment of an antenna.

Other features, elements, characteristics and advantages of the present disclosure will become more apparent from the following detailed description of embodiments of the present disclosure with reference to the attached drawings.

DETAILED DESCRIPTION

Underlying Knowledge of the Present Disclosure

Figure 18:
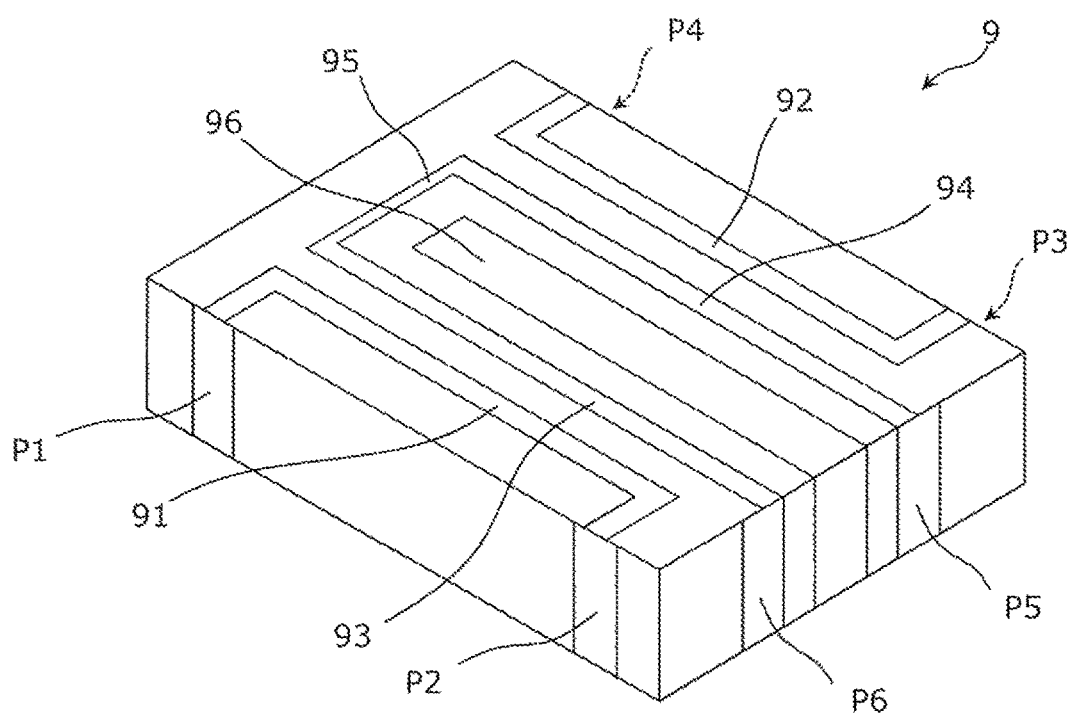
FIG. 18 is a perspective view that illustrates an example of a configuration of a directional coupler according to a related-art example.

Considered below are factors that cause the directivity of the directional coupler 9 in FIG. 18 relative to a forward direction signal and the directivity of the directional coupler 9 relative to a reverse direction signal to differ.

Figure 19:
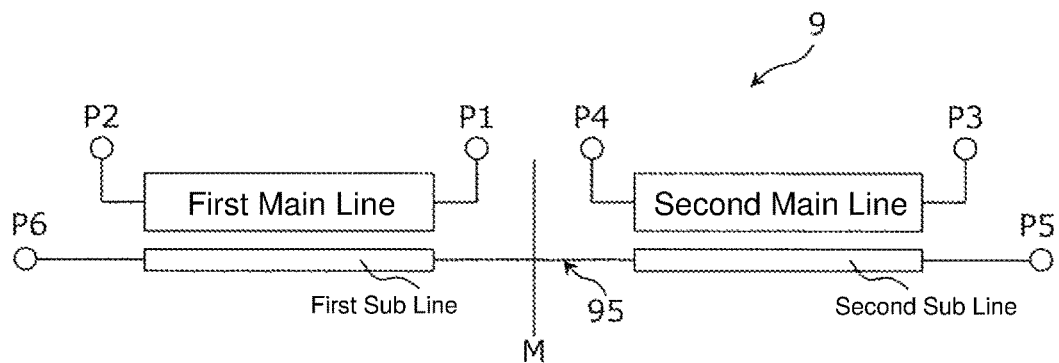
FIG. 19 is a circuit diagram that illustrates an example of an equivalent circuit of the directional coupler according to the related-art example.

FIG. 19 is a circuit diagram that illustrates an example of an equivalent circuit of the directional coupler 9. In FIG. 19, for understanding, a sub line 95 is illustrated as a straight line and a mid-point M in terms of electrical length of the sub line 95 is depicted.

As illustrated in FIG. 19, in the directional coupler 9, the first main line 91 and the first sub line 93 are coupled only between the mid-point M of the sub line 95 and the isolation port P6. The second main line 92 and the second sub line 94 are coupled only between the mid-point M of the sub line 95 and the coupling port P5. That is, a portion of the sub line 95 coupled to the first main line 91 and a portion of the sub line 95 coupled to the second main line 92 are asymmetrically arranged in the sub line 95.

Thus, electrical characteristics from the first main line 91 to the coupling port P5 of the sub line 95 and electrical characteristics from the first main line 91 to the isolation port P6 of the sub line 95 are different. Accordingly, a first monitor signal corresponding to a forward direction signal and a second monitor signal corresponding to a reverse direction signal, which propagate through the first main line 91, are respectively extracted from the coupling port P5 and the isolation port P6, each having difference in electrical characteristics from the first main line 91. As a result, a difference in characteristics with respect to a forward direction signal and a reverse direction signal that propagate through the first main line 91 of the directional coupler 9 is caused.

The similar applies to the second main line 92 and thus, in the directional coupler 9, a difference in characteristics is caused also with respect to a forward direction signal and a reverse direction signal that propagate through the second main line 92.

As described above, it is conceivable that the asymmetric arrangement of the coupled portions acts as the main factor that causes the directivity of the directional coupler 9 relative to a forward direction signal and the directivity of the directional coupler 9 relative to a reverse direction signal to differ from each other.

After diligently conducting reviews based on the above-described consideration, the present inventors have reached a bidirectional coupler including three main lines, where on each main line, characteristics with respect to a forward direction signal and characteristics with respect to a reverse direction signal are the same.

The bidirectional coupler includes a multilayer board; and a first main line, a second main line, a third main line, and an sub line that are provided in or on the multilayer board, the sub line including a first line portion that is electromagnetically coupled to the first main line, an even number of second line portions that are electromagnetically coupled to the second main line, and an even number of third line portions that are electromagnetically coupled to the third main line, a first half of the even number of second line portions being provided between the first line portion and a first end of the sub line, a second half of the even number of second line portions being provided between the first line portion and a second end of the sub line, a first half of the even number of third line portions being provided between the first half of the second line portions and the first end of the sub line, a second half of the even number of third line portions being provided between the second half of the second line portions and the second end of the sub line.

A plurality of embodiments of the present disclosure is described in detail below by referring to the drawings. All the embodiments described below present comprehensive or specific examples. The values, shapes, materials, constituent elements, arrangements and connection forms of the constituent elements, and the like mentioned in the embodiments below are examples and are not intended to limit the present disclosure. Among the constituent elements in the embodiments below, the constituent elements that are not recited in independent claims are described as given constituent elements. The sizes or size ratios of the constituent elements illustrated in the drawings are not necessarily precise.

First Embodiment

Figure 1:
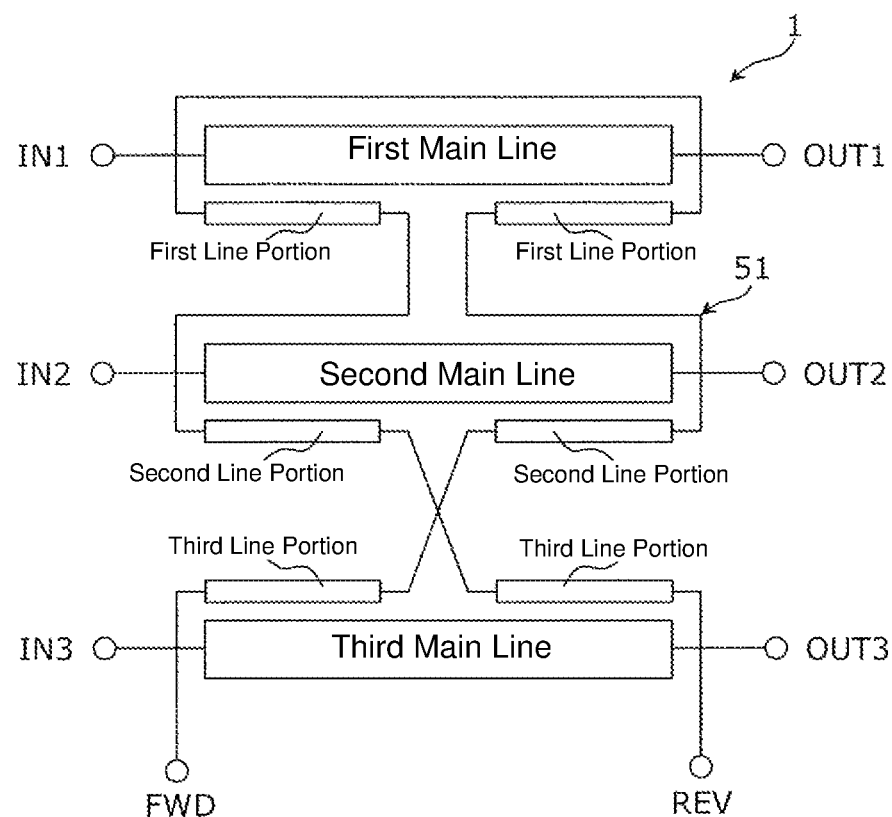
FIG. 1 is a circuit diagram that illustrates an example of an equivalent circuit of a bidirectional coupler according to a first embodiment.

FIG. 1 is a circuit diagram that illustrates an example of an equivalent circuit of a bidirectional coupler 1 according to a first embodiment.

As illustrated in FIG. 1, the bidirectional coupler 1 includes a first main line 21, a second main line 31, a third main line 41, and a sub line 51.

A first end and a second end of the first main line 21 constitute an input port IN1 and an output port OUT1, a first end and a second end of the second main line 31 constitute an input port IN2 and an output port OUT2, and a first end and a second end of the third main line 41 constitute an input port IN3 and an output port OUT3. A first end and a second end of the sub line 51 constitute a forward port FWD and a reverse port REV.

The sub line 51 includes a pair of first line portions 511a and 511b coupled to the first main line 21, a pair of second line portions 512a and 512b coupled to the second main line 31, and a pair of third line portions 513a and 513b coupled to the third main line 41. The pair of first line portions 511a and 511b is an example of the even number of first line portions, the pair of second line portions 512a and 512b is an example of the even number of second line portions, and the pair of third line portions 513a and 513b is an example of the even number of third line portions.

The first line portion 511a is provided between the reverse port REV and the forward port FWD and the first line portion 511b is provided between the first line portion 511a and the forward port FWD. Hereinafter, the first line portions 511a and 511b may be collectively referred to as the first line portion 511.

The second line portion 512a is provided between the first line portion 511 of the sub line 51 and the reverse port REV, and the second line portion 512b is provided between the first line portion 511 of the sub line 51 and the forward port FWD. The third line portion 513a is provided between the second line portion 512b of the sub line 51 and the forward port FWD, and the third line portion 513b is provided between the second line portion 512a of the sub line 51 and the reverse port REV.

The pair of first line portions 511a and 511b are provided to extend in a direction approximately identical to the direction in which the first main line 21 extends, and the pair of second line portions 512a and 512b are provided to extend in a direction approximately identical to the direction in which the second main line 31 extends, and the pair of third line portions 513a and 513b are provided to extend in a direction approximately identical to the direction in which the third main line 41 extends.

Figure 2:
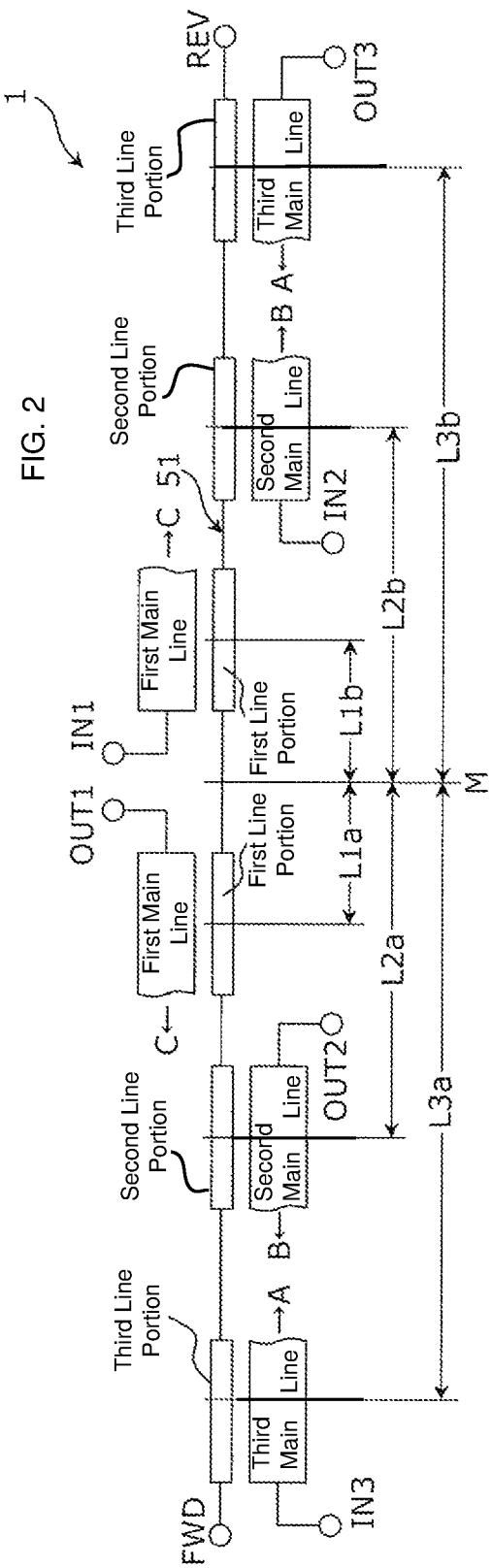
FIG. 2 is a circuit diagram that illustrates an example of the equivalent circuit of the bidirectional coupler according to the first embodiment.

FIG. 2 is a circuit diagram that illustrates a circuit identical to the equivalent circuit in FIG. 1. In FIG. 2, for understanding, the sub line 51 is illustrated as a straight line and a mid-point M in terms of the electrical length of the sub line 51 is depicted. Although illustrated as being divided into a half section on the side of the input port IN3 and the other half section on the side of the output port OUT3, the third main line 41 is continuous in actuality at portions A. Although illustrated as being divided into a half section on the side of the input port IN2 and the other half section on the side of the output port OUT2, the second main line 31 is continuous in actuality at portions B. Although illustrated as being divided into a partial section on the side of the input port IN1 and another partial section on the side of the output port OUT1, the first main line 21 is continuous in actuality at portions C.

As understood from FIG. 2, in the bidirectional coupler 1, a portion of the sub line 51 coupled to the first main line 21 is constituted of the pair of first line portions 511a and 511b and on both sides of the coupled portion, the second line portions 512a and 512b are provided, which constitute a portion of the sub line 51 coupled to the second main line 31. Thus, in the sub line 51, with the portion coupled to the first main line 21 (the first line portions 511a and 511b) positioned in the center, the portion coupled to the second main line 31 (the second line portions 512a and 512b) can be arranged symmetrically. The expression "with the portion coupled to the first main line 21 positioned in the center" indicates that the center line positioned centrally between the first line portion 511a and the first line portion 511b that are coupled to the first main line 21 serves as the reference.

Further, in the bidirectional coupler 1, a portion of the sub line 51 coupled to the second main line 31 is constituted of the pair of second line portions 512a and 512b and on both sides of the coupled portion, the third line portions 513a and 513b are provided, which constitute a portion coupled to the third main line 41. Thus, in the sub line 51, with the portion coupled to the second main line 31 (the second line portions 512a and 512b) positioned in the center, the coupled portion with the third main line 41 (the third line portions 513a and 513b) can be arranged substantially symmetrically. The expression "with the portion coupled to the second main line 31 positioned in the center" indicates that the center line positioned centrally between the second line portion 512a and the second line portion 512b that become coupled to the second main line 31 serves as the reference.

By arranging the coupled portions as described above, electrical characteristics from the first main line 21 to the forward port FWD and the reverse port REV can be substantially equalized, electrical characteristics from the second main line 31 to the forward port FWD and the reverse port REV can be substantially equalized, and electrical characteristics from the third main line 41 to the forward port FWD and the reverse port REV can be substantially equalized. In addition, by dividing the first line portion to be arranged as the pair of first line portions 511a and 511b, flexibility in the shape of the sub line 51 can be increased.

Accordingly, both the directivity of a first monitor signal corresponding to a forward direction signal and the directivity of a second monitor signal corresponding to a reverse direction signal can be enhanced. As a result, the bidirectional coupler 1 can be obtained, where for all of the first main line 21, the second main line 31, the third main line 41, both the directivity relative to a forward direction signal and the directivity relative to a reverse direction signal are enhanced.

As illustrated in FIG. 2, in the sub line 51, an electrical length L1b between the mid-point M and the first line portion 511a and an electrical length L1a between the mid-point M and the first line portion 511b may be approximately equal. An electrical length L2b between the mid-point M and the second line portion 512a and an electrical length L2a between the mid-point M and the second line portion 512b may be approximately equal. An electrical length L3a between the mid-point M and the third line portion 513a and an electrical length L3b between the mid-point M and the third line portion 513b may be approximately equal. The electrical length L1a and the electrical length L1b are approximately equal when for example, a difference between the electrical length L1a and the electrical length L1b is ±10% or less of one of the electrical length L1a and the electrical length L1b. The electrical length L2a and the electrical length L2b are approximately equal when for example, a difference between the electrical length L2a and the electrical length L2b is ±10% or less of one of the electrical length L2a and the electrical length L2b. The electrical length L3a and the electrical length L3b are approximately equal when for example, a difference between the electrical length L3a and the electrical length L3b is ±10% or less of one of the electrical length L3a and the electrical length L3b.

Thus, in the sub line 51, the first line portions 511a and 511b are arranged at symmetric positions in terms of the electrical length on the sub line 51, the second line portions 512a and 512b are arranged at symmetric positions in terms of the electrical length on the sub line 51, and the third line portions 513a and 513b are arranged at symmetric positions in terms of the electrical length on the sub line 51. Accordingly, electrical characteristics from the first main line 21, the second main line 31, and the third main line 41 to the forward port FWD and the reverse port REV can be substantially equalized more accurately. As a result, the bidirectional coupler 1 can be obtained, where both the directivity relative to a forward direction signal and the directivity relative to a reverse direction signal are enhanced.

Features of a configuration of the bidirectional coupler 1 are described below.

Figure 3:
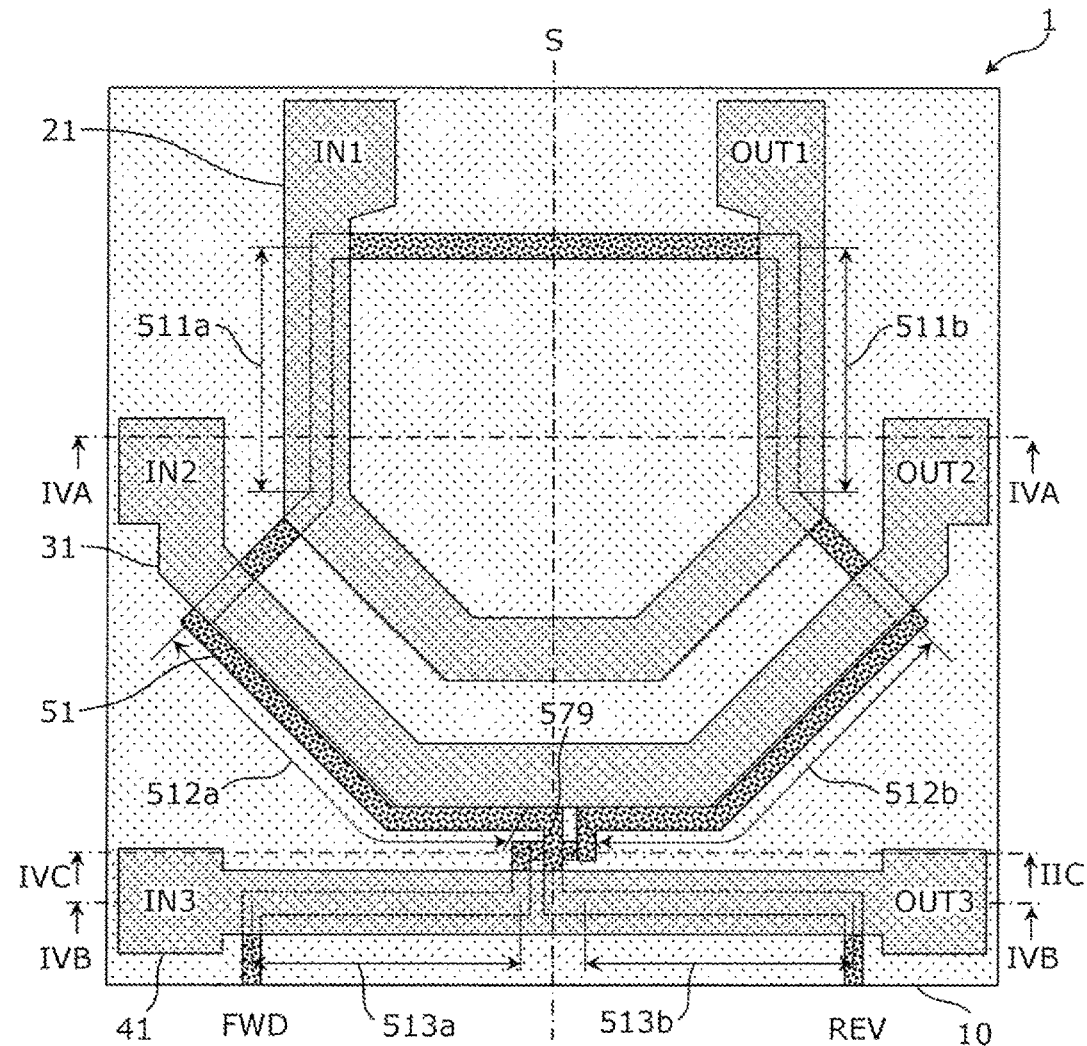
FIG. 3 is a plan view that illustrates an example of a configuration of the bidirectional coupler according to the first embodiment.
Figure 4A:
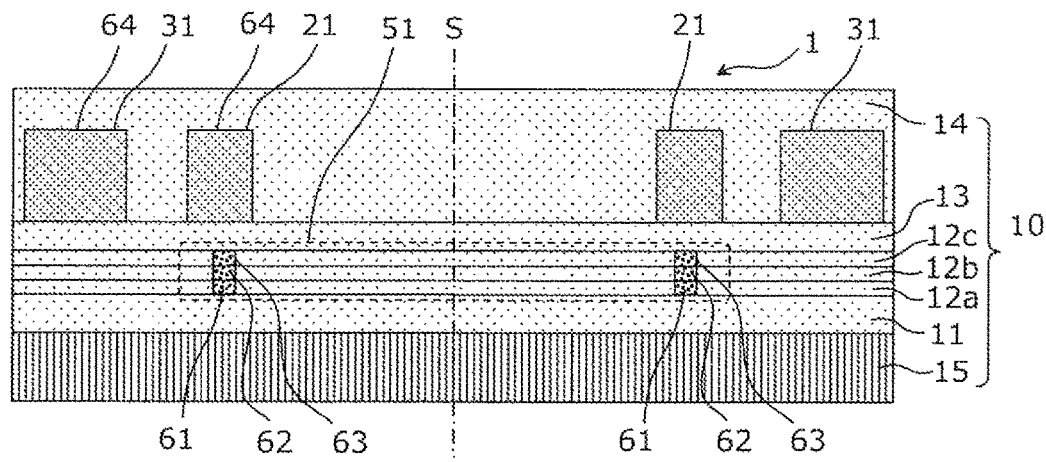
FIG. 4A is a cross-sectional view that illustrates an example of a configuration of the bidirectional coupler according to the first embodiment.
Figure 4B:
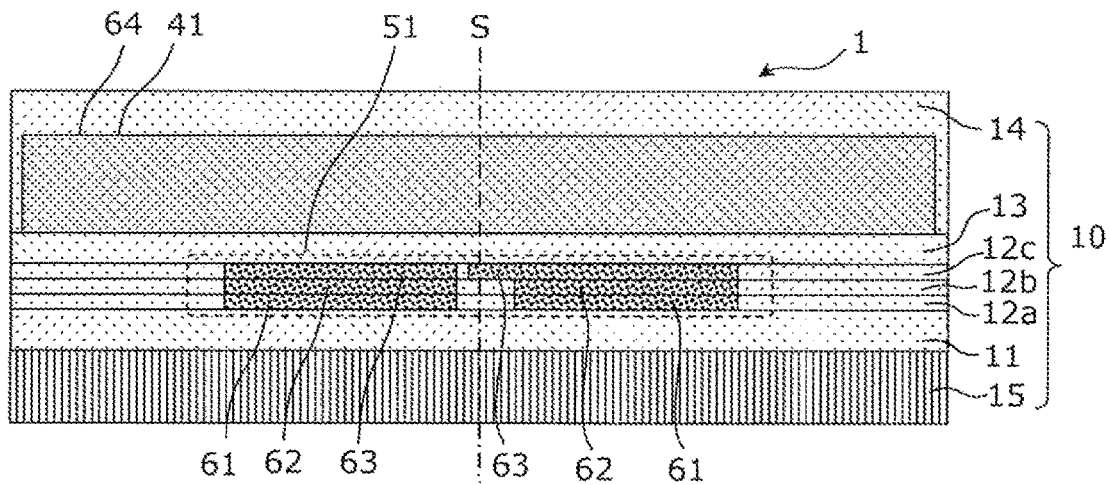
FIG. 4B is a cross-sectional view that illustrates an example of a configuration of the bidirectional coupler according to the first embodiment.

FIG. 3 is a plan view that illustrates an example of a configuration of the bidirectional coupler 1. FIG. 4A is a cross-sectional view that illustrates an example of a configuration of the bidirectional coupler 1 and corresponds to a cross section when the IVA-IVA cross-sectional line in FIG. 3 is viewed in a direction indicated by arrows. FIG. 4B is a cross-sectional view that illustrates an example of a configuration of the bidirectional coupler 1 and corresponds to a cross section when the IVB-IVB cross-sectional line in FIG. 3 is viewed in the direction indicated by the arrows. In FIG. 3, FIG. 4A, and FIG. 4B, different patterns are given to the constituent elements for clarification.

As illustrated in FIG. 4A and FIG. 4B, the bidirectional coupler 1 is formed over a substrate 15 and is made up of a first layer metal wiring 61, a second layer metal wiring 62, a third layer metal wiring 63, and a fourth layer metal wiring 64, each separated by interlayer insulation layers 11, 12a, 12b, 12c, 13, and 14. For example, a multilayer body of the substrate 15 and the interlayer insulation layers 11 to 14 corresponds to the multilayer board 10.

The first layer metal wiring 61 is arranged in or on the same layer as the interlayer insulation layer 12a, the second layer metal wiring 62 is arranged in or on the same layer as the interlayer insulation layer 12b, and the third layer metal wiring 63 is arranged in or on the same layer as the interlayer insulation layer 12c. The fourth layer metal wiring 64 is arranged on an interface between the interlayer insulation layer 13 and the interlayer insulation layer 14.

The sub line 51 is formed by the first layer metal wiring 61, the second layer metal wiring 62, and the third layer metal wiring 63. The first main line 21, the second main line 31, and the third main line 41 are formed by the fourth layer metal wiring 64.

For example, the substrate 15 may be a semiconductor substrate (wafer). In this case, the bidirectional coupler 1 is manufactured by forming a plurality of wiring layers on the semiconductor substrate with interlayer insulation layers interposed therebetween using known semiconductor processes.

For another example, the substrate 15 and the interlayer insulation layers 11, 12a to 12c, 13, and 14 may be a base layer made from a low-temperature co-fired ceramics (LTCC) material. In this case, the bidirectional coupler 1 is manufactured by overlaying a plurality of ceramic green sheets, where a conductor paste that serves as metal wiring is arranged, and integrating and firing the sheets.

For still another example, the substrate 15 and the interlayer insulation layers 11, 12a to 12c, 13, and 14 may be insulation resin layers that constitute layers of a multilayer printed circuit board. In this case, the bidirectional coupler 1 is manufactured as a multilayer printed circuit board made by laminating a plurality of insulation resin layers, where wiring patterns as metal wiring are arranged, and providing through holes as via conductors to the insulation resin layers.

As illustrated in FIG. 3, the sub line 51 includes a grade separated crossing portion 579 in a region between the second main line 31 and the third main line 41 in a plan view. Specifically, the grade separated crossing portion 579 crosses between the second line portion 512a and the third line portion 513b and between the second line portion 512b and the third line portion 513a.

Figure 4C:
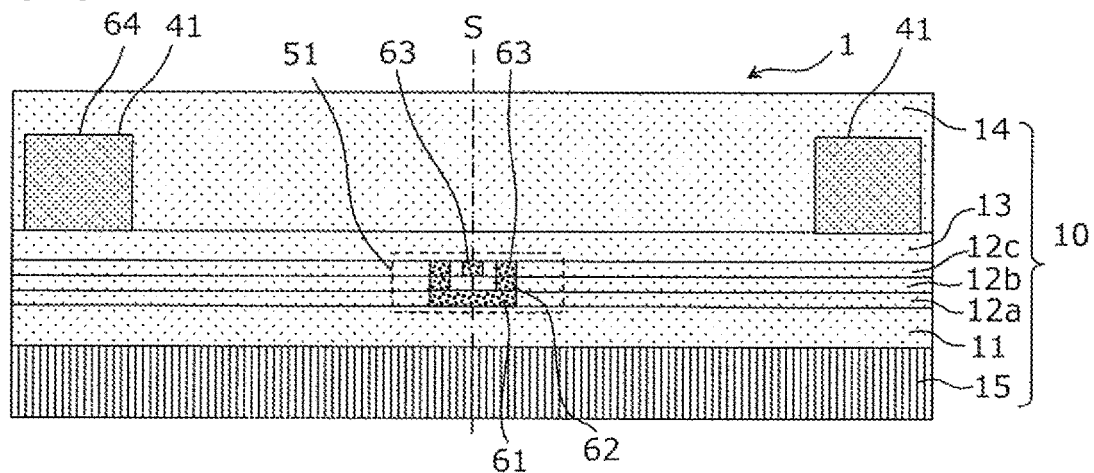
FIG. 4C is a cross-sectional view that illustrates an example of a configuration of the bidirectional coupler according to the first embodiment.

FIG. 4C is a cross-sectional view that illustrates an example of a configuration of the bidirectional coupler 1 and corresponds to a cross section when the IVC-IVC cross-sectional line in FIG. 3 is viewed in the direction indicated by the arrows.

As illustrated in FIG. 4C, in the grade separated crossing portion 579, a wiring path from the third line portion 513a to the second line portion 512b is formed by the first layer metal wiring 61 positioned on the lower side and a wiring path from the second line portion 512a to the third line portion 513b is formed by the third layer metal wiring 63 positioned on the upper side. The wiring paths can prevent parts of the sub line 51 from coming into contact with each other in the grade separated crossing portion 579.

Figure 5:
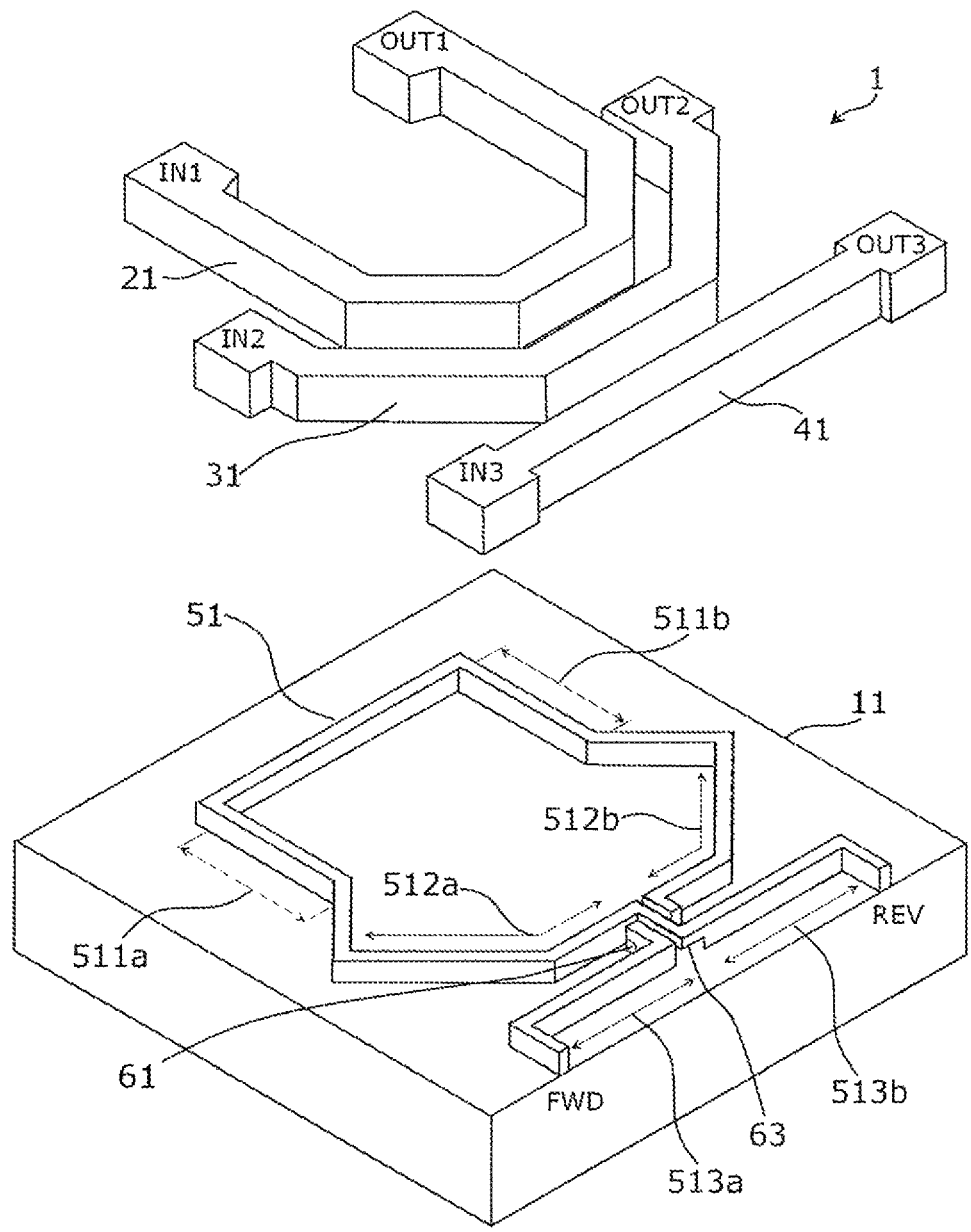
FIG. 5 is an exploded perspective view that illustrates an example of a three-dimensional configuration of the bidirectional coupler according to the first embodiment.

FIG. 5 is an exploded perspective view that illustrates an example of a three-dimensional configuration of the bidirectional coupler 1. In FIG. 5, to simplify the illustration of the shape of the sub line 51, the interlayer insulation layers 12a to 12c, 13, and 14 are omitted and the first main line 21, the second main line 31, and the third main line 41 are depicted further on the upper side than the actual positions thereof.

As illustrated in FIG. 5, the first main line 21 and the second main line 31 are approximately formed like a substantially V-shaped (or U-shaped) nest with different opening angles, where the first main line 21 is arranged inside and the second main line 31 is arranged outside. The third main line 41 is formed on the side opposite the side on which the first main line 21 is positioned when viewed from the second main line 31. The third main line 41 is like a substantially straight line and has an opening angle of 180°. That is, the opening angles of the main lines increase in order of the first main line 21, the second main line 31, and the third main line 41. The sub line 51 is formed to have a track-like (or loop) shape of a single lap (or a single round). The sub line 51 runs from the forward port FWD in the track-like (or loop) shape along part of the third main line 41, part of the second main line 31, part of the first main line 21, part of the second main line 31, and part of the third main line 41 and reaches the reverse port REV.

As illustrated in FIG. 5, in the bidirectional coupler 1, the third line portion 513a provided to extend in a direction approximately identical to the direction in which the third main line 41 extends is present in a ⅙ lap section of the sub line 51 from the forward port FWD and the third line portion 513a is coupled to the half section of the third main line 41 on the side of the input port IN3. Further, the second line portion 512b provided to extend in a direction approximately identical to the direction in which the second main line 31 extends is present in a subsequent ⅙ lap section of the sub line 51 and the second line portion 512b is coupled to the half section of the second main line 31 on the side of the output port OUT2. Further, the first line portion 511b provided to extend in a direction approximately identical to the direction in which the first main line 21 extends is present in a subsequent ⅙ lap section of the sub line 51 and the first line portion 511b is coupled to a partial section of the first main line 21 on the side of the output port OUT1.

Further, the first line portion 511a provided to extend in a direction approximately identical to the direction in which the first main line 21 extends is present in a subsequent ⅙ lap section of the sub line 51 and the first line portion 511a is coupled to another partial section of the first main line 21 on the side of the input port IN1. Further, the second line portion 512a provided to extend in a direction approximately identical to the direction in which the second main line 31 extends is present in a subsequent ⅙ lap section of the sub line 51 and the second line portion 512a is coupled to the half section of the second main line 31 on the side of the input port IN2. Further, the third line portion 513b provided to extend in a direction approximately identical to the direction in which the third main line 41 extends is present in the remaining ⅙ lap section of the sub line 51 and the third line portion 513b is coupled to the half section of the third main line 41 on the side of the output port OUT3.

As illustrated in FIG. 3 and FIG. 5, in a first region and a second region on the multilayer board 10 with a straight line S positioned therebetween, the sub line 51 is provided to substantially have a shape of line symmetry with the straight line S serving as the axis of symmetry, and the first line portions 511a and 511b, the second line portions 512a and 512b, and the third line portions 513a and 513b are each at corresponding positions in the line symmetry. In other words, the sub line 51 is arranged in or on the multilayer board 10 in line symmetry with the line S (the line of symmetry) passing through the multilayer board 10 in a plan view, and the first line portions 511a and 511b, the second line portions 512a and 512b, and the third line portions 513a and 513b are each arranged on opposite sides of the line S and at corresponding symmetrical positions about the line of symmetry. Hereinafter, that the sub line is provided to substantially have a shape of line symmetry" includes a case where for example, the sub line is provided to substantially have a shape of line symmetry except the grade separated crossing portion 579 illustrated in FIG. 3 and FIG. 5.

Accordingly, on the basis of the shape of the sub line 51 that is symmetric, electrical characteristics from the first main line 21, the second main line 31, and the third main line 41 to the forward port FWD and the reverse port REV can be substantially equalized more accurately. As a result, the bidirectional coupler 1 can be obtained, where both the directivity relative to a forward direction signal and the directivity relative to a reverse direction signal are enhanced.

Second Embodiment

In a second embodiment, variations of the first main line, the second main line, the third main line, and the sub line are described.

Figure 6:
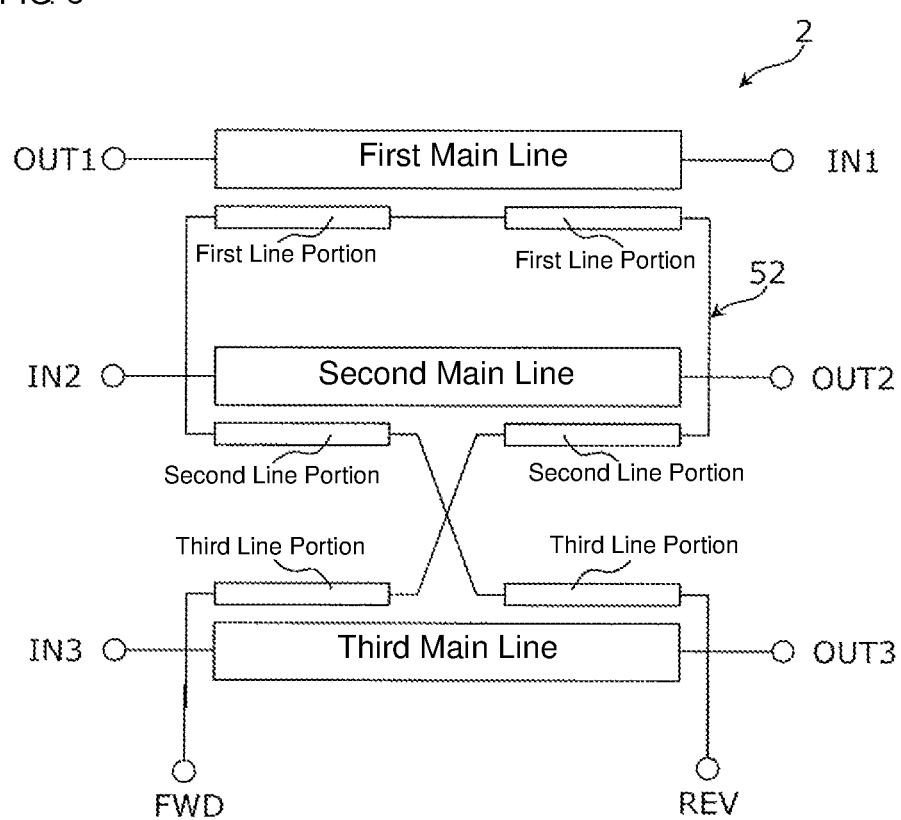
FIG. 6 is a circuit diagram that illustrates an example of an equivalent circuit of a bidirectional coupler according to a second embodiment.

FIG. 6 is a circuit diagram that illustrates an example of an equivalent circuit of a bidirectional coupler 2.

As illustrated in FIG. 6, the bidirectional coupler 2 includes a first main line 22, a second main line 32, a third main line 42, and a sub line 52.

A first end and a second end of the first main line 22 constitute an input port IN1 and an output port OUT1, a first end and a second end of the second main line 32 constitute an input port IN2 and an output port OUT2, and a first end and a second end of the third main line 42 constitute an input port IN3 and an output port OUT3. A first end and a second end of the sub line 52 constitute a forward port FWD and a reverse port REV.

The sub line 52 includes a pair of first line portions 521a and 521b, each coupled to the first main line 22, a pair of second line portions 522a and 522b, each coupled to the second main line 32, and a pair of third line portions 523a and 523b, each coupled to the third main line 42.

The first line portion 521a is provided between the reverse port REV and the forward port FWD and the first line portion 521b is provided between the first line portion 521a and the forward port FWD. Hereinafter, the first line portions 521a and 521b may be collectively referred to as the first line portion 521.

The second line portion 522a is provided between the first line portion 521 of the sub line 52 and the reverse port REV and the second line portion 522b is provided between the first line portion 521 of the sub line 52 and the forward port FWD. The third line portion 523a is provided between the second line portion 522b of the sub line 52 and the forward port FWD and the third line portion 523b is provided between the second line portion 522a of the sub line 52 and the reverse port REV.

The pair of first line portions 521a and 521b are provided to extend in a direction approximately identical to the direction in which the first main line 22 extends, and the pair of second line portions 522a and 522b are provided to extend in a direction approximately identical to the direction in which the second main line 32 extends, and the pair of third line portions 523a and 523b are provided to extend in a direction approximately identical to the direction in which the third main line 42 extends.

Also in the bidirectional coupler 2, a portion of the sub line 52 coupled to the first main line 22 is constituted of the pair of first line portions 521a and 521b and on both sides of the coupled portion to the first main line 22, the second line portions 522a and 522b are provided, which constitute a portion of the sub line 52 coupled to the second main line 32. Thus, in the sub line 52, with the portion coupled to the first main line 22 (the first line portions 521a and 521b) positioned in the center, the portion coupled to the second main line 32 (the second line portions 522a and 522b) can be arranged symmetrically.

Further, in the bidirectional coupler 2, a portion of the sub line 52 coupled to the second main line 32 is constituted of the pair of second line portions 522a and 522b and on both sides of the coupled portion to the second main line 32, the third line portions 523a and 523b are provided, which constitute a portion coupled to the third main line 42. Thus, in the sub line 52, with the portion coupled to the second main line 32 (the second line portions 522a and 522b) positioned in the center, the portion coupled to the third main line 42 (the third line portions 523a and 523b) can be arranged symmetrically.

By arranging the coupled portions as described above, electrical characteristics from the first main line 22 to the forward port FWD and the reverse port REV can be substantially equalized, electrical characteristics from the second main line 32 to the forward port FWD and the reverse port REV can be substantially equalized, and electrical characteristics from the third main line 42 to the forward port FWD and the reverse port REV can be substantially equalized.

Accordingly, a first monitor signal corresponding to a forward direction signal and a second monitor signal corresponding to a reverse direction signal can be respectively extracted from the forward port FWD and the reverse port REV, where electrical characteristics from the first main line 22, the second main line 32, and the third main line 42 are substantially equalized. As a result, the bidirectional coupler 2 can be obtained, where for all of the first main line 22, the second main line 32, the third main line 42, both the directivity relative to a forward direction signal and the directivity relative to a reverse direction signal are enhanced.

Features of a configuration of the bidirectional coupler 2 are described below.

Figure 7:
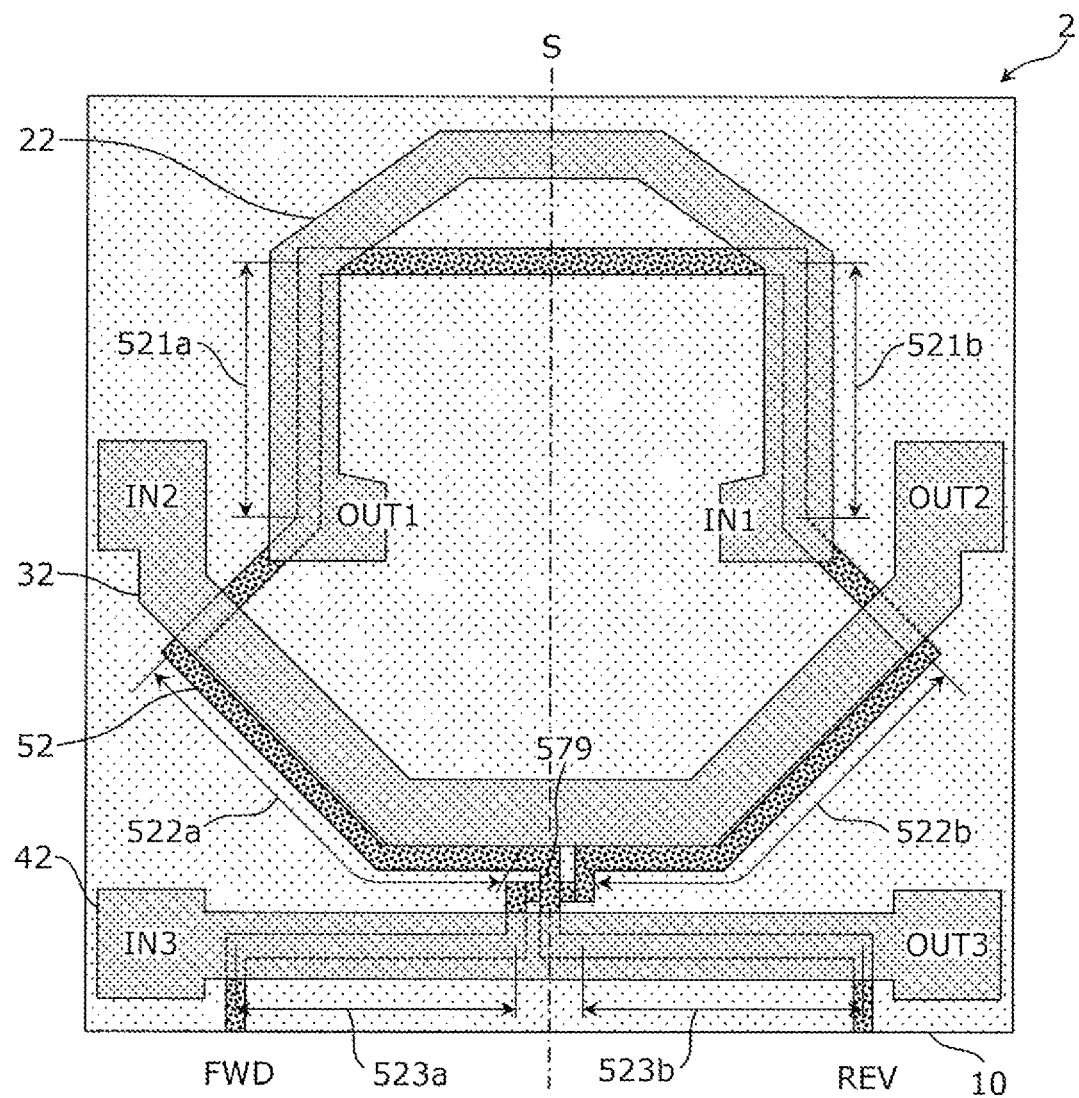
FIG. 7 is a plan view that illustrates an example of a configuration of the bidirectional coupler according to the second embodiment.

FIG. 7 is a plan view that illustrates an example of a configuration of the bidirectional coupler 2. The bidirectional coupler 2 in FIG. 7 is different from the bidirectional coupler 1 according to the first embodiment in the shape of the first main line 22.

As illustrated in FIG. 7, the first main line 22 and the second main line 32 are approximately formed like a substantially V-shaped (or U-shaped) nest with different opening angles, where the first main line 22 is arranged inside and the second main line 32 is arranged outside. Specifically, the first main line 22 is like a substantially reverse shape of the letter V (or U) and forms a nest-like configuration so that an opening of the first main line 22 and an opening of the second main line 32 face each other. The third main line 42 is formed on the side opposite the side on which the first main line 22 is positioned when viewed from the second main line 32. The third main line 42 is like a substantially straight line and has an opening angle of 180°. The sub line 52 is formed to have a track-like (or loop) shape of a single lap (or a single round). The sub line 52 runs from the forward port FWD in the track-like (or loop) shape along part of the third main line 42, part of the second main line 32, part of the first main line 22, part of the second main line 32, and part of the third main line 42 and reaches the reverse port REV. The sub line 52 includes a grade separated crossing portion 579 in a region between the second main line 32 and the third main line 42 in a plan view.

As illustrated in FIG. 7, in the bidirectional coupler 2, the third line portion 523a provided to extend in a direction approximately identical to the direction in which the third main line 42 extends is present in a ⅙ lap section of the sub line 52 from the forward port FWD and the third line portion 523a is coupled to the half section of the third main line 42 on the side of the input port IN3. Further, the second line portion 522b provided to extend in a direction approximately identical to the direction in which the second main line 32 extends is present in a subsequent ⅙ lap section of the sub line 52 and the second line portion 522b is coupled to the half section of the second main line 32 on the side of the output port OUT2. Further, the first line portion 521b provided to extend in a direction approximately identical to the direction in which the first main line 22 extends is present in a subsequent ⅙ lap section of the sub line 52 and the first line portion 521b is coupled to a partial section of the first main line 22 on the side of the input port IN1.

Further, the first line portion 521a provided to extend in a direction approximately identical to the direction in which the first main line 22 extends is present in a subsequent ⅙ lap section of the sub line 52 and the first line portion 521a is coupled to another partial section of the first main line 22 on the side of the output port OUT1. Further, the second line portion 522a provided to extend in a direction approximately identical to the direction in which the second main line 32 extends is present in a subsequent ⅙ lap section of the sub line 52 and the second line portion 522a is coupled to the half section of the second main line 32 on the side of the input port IN2. Further, the third line portion 523b provided to extend in a direction approximately identical to the direction in which the third main line 42 extends is present in the remaining ⅙ lap section of the sub line 52 and the third line portion 523b is coupled to the half section of the third main line 42 on the side of the output port OUT3.

As illustrated in FIG. 7, in a first region and a second region on a multilayer board 10 with a straight line S positioned therebetween, the sub line 52 is provided to substantially have a shape of line symmetry with the straight line S serving as the axis of symmetry, and the first line portions 521a and 521b, the second line portions 522a and 522b, and the third line portions 523a and 523b are each at corresponding symmetrical positions about the line of symmetry. In other words, the sub line 52 is arranged in or on the multilayer board 10 in line symmetry with the line S (the line of symmetry) passing through the multilayer board 10 in a plan view, and the first line portions 521a and 521b, the second line portions 522a and 522b, and the third line portions 523a and 523b are each arranged on opposite sides of the line S and at corresponding symmetrical positions about the line of symmetry.

Accordingly, on the basis of the shape of the sub line 52 that is symmetric, electrical characteristics from the first main line 22, the second main line 32, and the third main line 42 to the forward port FWD and the reverse port REV can be substantially equalized more accurately. As a result, the bidirectional coupler 2 can be obtained, where both the directivity relative to a forward direction signal and the directivity relative to a reverse direction signal are enhanced.

Third Embodiment

In a third embodiment, variations of the first main line, the second main line, the third main line, and the sub line are described.

Figure 8:
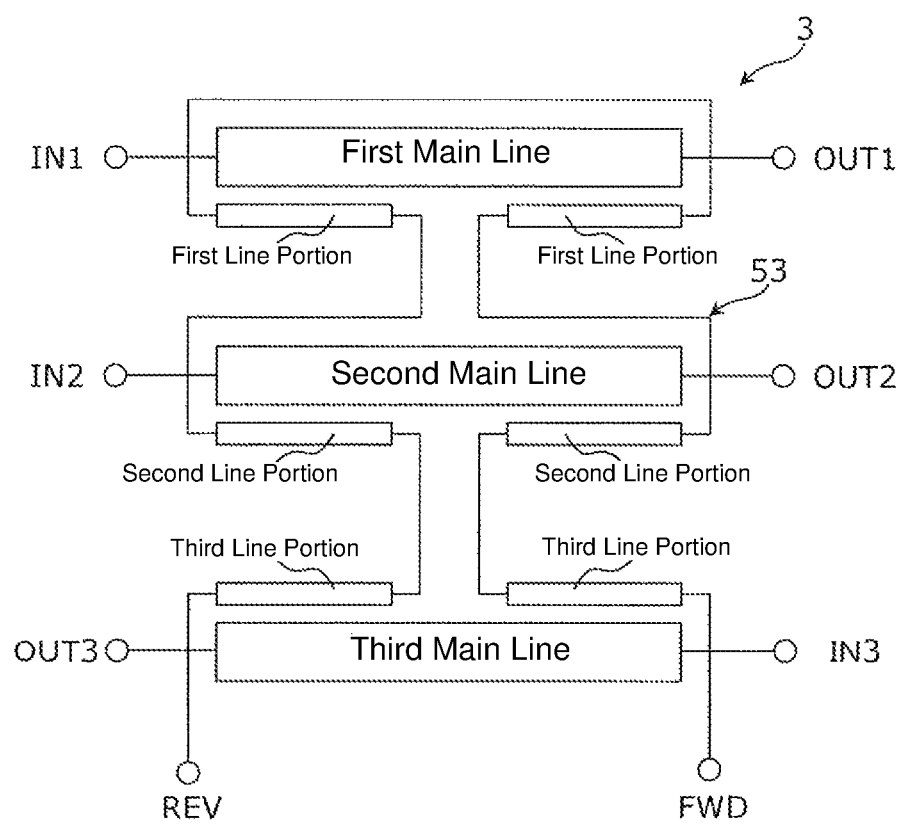
FIG. 8 is a circuit diagram that illustrates an example of an equivalent circuit of a bidirectional coupler according to a third embodiment.

FIG. 8 is a circuit diagram that illustrates an example of an equivalent circuit of a bidirectional coupler 3.

As illustrated in FIG. 8, the bidirectional coupler 3 includes a first main line 23, a second main line 33, a third main line 43, and a sub line 53.

A first end and a second end of the first main line 23 constitute an input port IN1 and an output port OUT1, a first end and a second end of the second main line 33 constitute an input port IN2 and an output port OUT2, and a first end and a second end of the third main line 43 constitute an input port IN3 and an output port OUT3. A first end and a second end of the sub line 53 constitute a forward port FWD and a reverse port REV.

The sub line 53 includes a pair of first line portions 531a and 531b, which become coupled to the first main line 23, a pair of second line portions 532a and 532b, which become coupled to the second main line 33, and a pair of third line portions 533a and 533b, which become coupled to the third main line 43.

The first line portion 531a is provided between the reverse port REV and the forward port FWD and the first line portion 531b is provided between the first line portion 531a and the forward port FWD. Hereinafter, the first line portions 531a and 531b may be collectively referred to as the first line portion 531.

The second line portion 532a is provided between the first line portion 531 of the sub line 53 and the reverse port REV, and the second line portion 532b is provided between the first line portion 531 of the sub line 53 and the forward port FWD. The third line portion 533a is provided between the second line portion 532a of the sub line 53 and the reverse port REV, and the third line portion 533b is provided between the second line portion 532b of the sub line 53 and the forward port FWD.

The pair of first line portions 531a and 531b are provided to extend in a direction approximately identical to the direction in which the first main line 23 extends, and the pair of second line portions 532a and 532b are provided to extend in a direction approximately identical to the direction in which the second main line 33 extends, and the pair of third line portions 533a and 533b are provided to extend in a direction approximately identical to the direction in which the third main line 43 extends.

Also in the bidirectional coupler 3, a portion of the sub line 53 coupled to the first main line 23 is constituted of the pair of first line portions 531a and 531b and on both sides of the coupled portion to the first main line 23, the second line portions 532a and 532b are provided, which constitute a portion of the sub line 53 coupled to the second main line 33. Thus, in the sub line 53, with the portion coupled to the first main line 23 (the first line portions 531a and 531b) positioned in the center, the portion coupled to the second main line 33 (the second line portions 532a and 532b) can be arranged symmetrically.

Further in the bidirectional coupler 3, a portion of the sub line 53 coupled to the second main line 33 is constituted of the pair of second line portions 532a and 532b and on both sides of the coupled portion to the second main line 33, the third line portions 533a and 533b are provided, which constitute a portion coupled to the third main line 43. Thus, in the sub line 53, with the portion coupled to the second main line 33 (the second line portions 532a and 532b) positioned in the center, the portion coupled to the third main line 43 (the third line portions 533a and 533b) can be arranged symmetrically.

By arranging the coupled portions as described above, electrical characteristics from the first main line 23 to the forward port FWD and the reverse port REV can be substantially equalized, electrical characteristics from the second main line 33 to the forward port FWD and the reverse port REV can be substantially equalized, and electrical characteristics from the third main line 43 to the forward port FWD and the reverse port REV can be substantially equalized.

Accordingly, a first monitor signal corresponding to a forward direction signal and a second monitor signal corresponding to a reverse direction signal can be respectively extracted from the forward port FWD and the reverse port REV, where electrical characteristics from the first main line 23, the second main line 33, and the third main line 43 are substantially equalized. As a result, the bidirectional coupler 3 can be obtained, where for all of the first main line 23, the second main line 33, the third main line 43, both the directivity relative to a forward direction signal and the directivity relative to a reverse direction signal are enhanced.

Features of a configuration of the bidirectional coupler 3 are described below.

Figure 9:
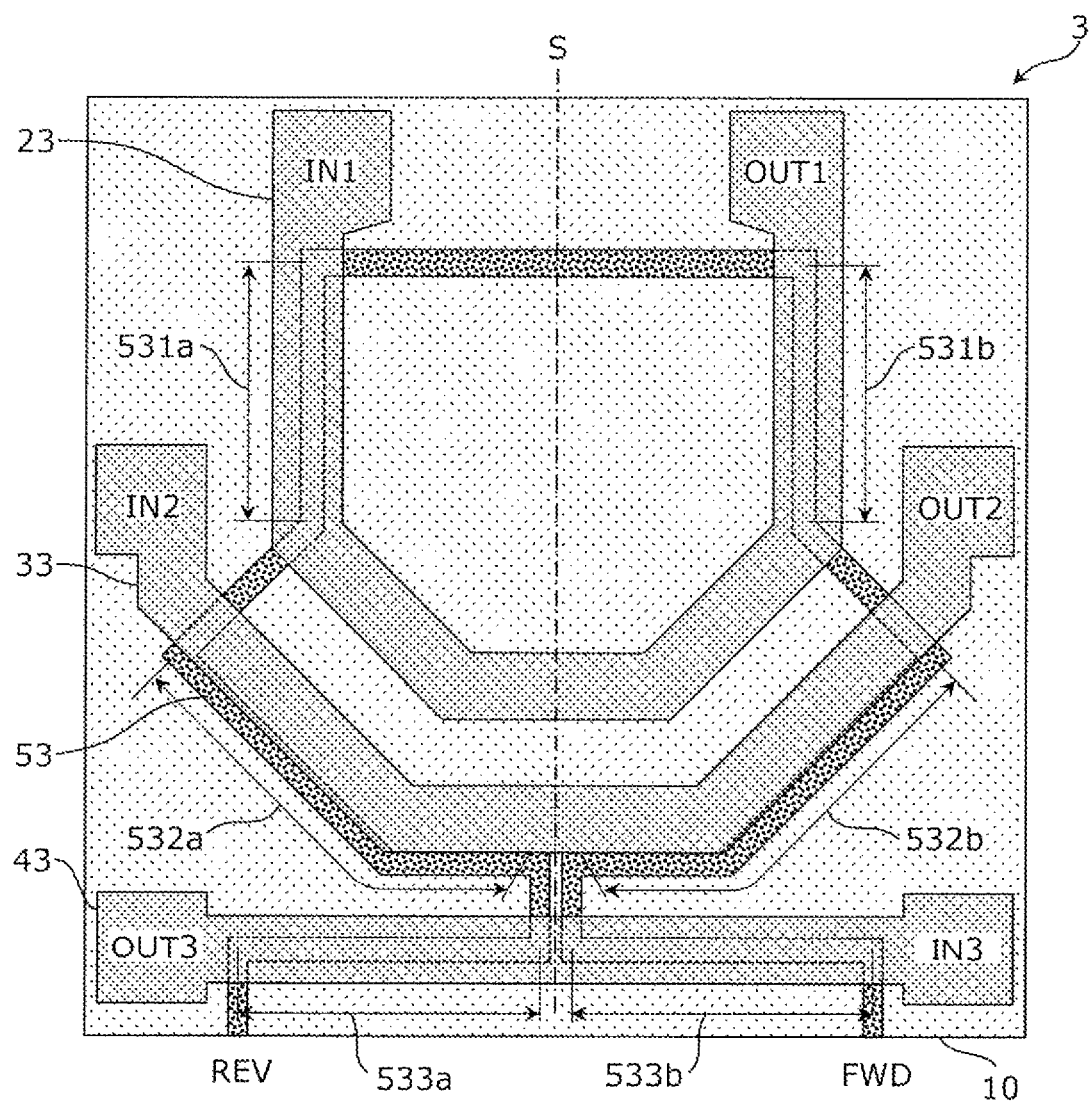
FIG. 9 is a plan view that illustrates an example of a configuration of the bidirectional coupler according to the third embodiment.

FIG. 9 is a plan view that illustrates an example of a configuration of the bidirectional coupler 3. The bidirectional coupler 3 in FIG. 9 is different from the bidirectional coupler 1 according to the first embodiment in the shape of the sub line 53.

As illustrated in FIG. 9, the first main line 23 and the second main line 33 are approximately formed like a substantially V-shaped (or U-shaped) nest with different opening angles, where the first main line 23 is arranged inside and the second main line 33 is arranged outside. The third main line 43 is formed on the side opposite the side on which the first main line 23 is positioned when viewed from the second main line 33. The third main line 43 is like a substantially straight line and has an opening angle of 180°. That is, the opening angles of the main lines increase in order of the first main line 23, the second main line 33, and the third main line 43. The sub line 53 is formed to have a track-like (or loop) shape of a single lap (or a single round) having no grade separated crossing. The sub line 53 runs from the forward port FWD in the track-like (or loop) shape along part of the third main line 43, part of the second main line 33, part of the first main line 23, part of the second main line 33, and part of the third main line 43 and reaches the reverse port REV.

As illustrated in FIG. 9, in the bidirectional coupler 3, the third line portion 533b provided to extend in a direction approximately identical to the direction in which the third main line 43 extends is present in a ⅙ lap section of the sub line 53 from the forward port FWD and the third line portion 533b is coupled to the half section of the third main line 43 on the side of the input port IN3. Further, the second line portion 532b provided to extend in a direction approximately identical to the direction in which the second main line 33 extends is present in a subsequent ⅙ lap section of the sub line 53 and the second line portion 532b is coupled to the half section of the second main line 33 on the side of the output port OUT2. Further, the first line portion 531b provided to extend in a direction approximately identical to the direction in which the first main line 23 extends is present in a subsequent ⅙ lap section of the sub line 53 and the first line portion 531b is coupled to a partial section of the first main line 23 on the side of the output port OUT1.

Further, the first line portion 531a provided to extend in a direction approximately identical to the direction in which the first main line 23 extends is present in a subsequent ⅙ lap section of the sub line 53 and the first line portion 531a is coupled to another partial section of the first main line 23 on the side of the input port IN1. Further, the second line portion 532a provided to extend in a direction approximately identical to the direction in which the second main line 33 extends is present in a subsequent ⅙ lap section of the sub line 53 and the second line portion 532a is coupled to the half section of the second main line 33 on the side of the input port IN2. Further, the third line portion 533a provided to extend in a direction approximately identical to the direction in which the third main line 43 extends is present in the remaining ⅙ lap section of the sub line 53 and the third line portion 533a is coupled to the half section of the third main line 43 on the side of the output port OUT3.

As illustrated in FIG. 9, in a first region and a second region on a multilayer board 10 with a straight line S positioned therebetween, the sub line 53 is provided to substantially have a shape of line symmetry with the straight line S serving as the axis of symmetry, and the first line portions 531a and 531b, the second line portions 532a and 532b, and the third line portions 533a and 533b are each at corresponding symmetrical positions about the line of symmetry. In other words, the sub line 53 is arranged in or on the multilayer board 10 in line symmetry with the line S (the line of symmetry) passing through the multilayer board 10 in a plan view, and the first line portions 531a and 531b, the second line portions 532a and 532b, and the third line portions 533a and 533b are each arranged on opposite sides of the line S and at corresponding symmetrical positions about the line of symmetry.

Accordingly, on the basis of the shape of the sub line 53 that is symmetric, electrical characteristics from the first main line 23, the second main line 33, and the third main line 43 to the forward port FWD and the reverse port REV can be substantially equalized more accurately. As a result, the bidirectional coupler 3 can be obtained, where both the directivity relative to a forward direction signal and the directivity relative to a reverse direction signal are enhanced.

Fourth Embodiment

In a fourth embodiment, variations of the first main line, the second main line, the third main line, and the sub line are described.

Figure 10:
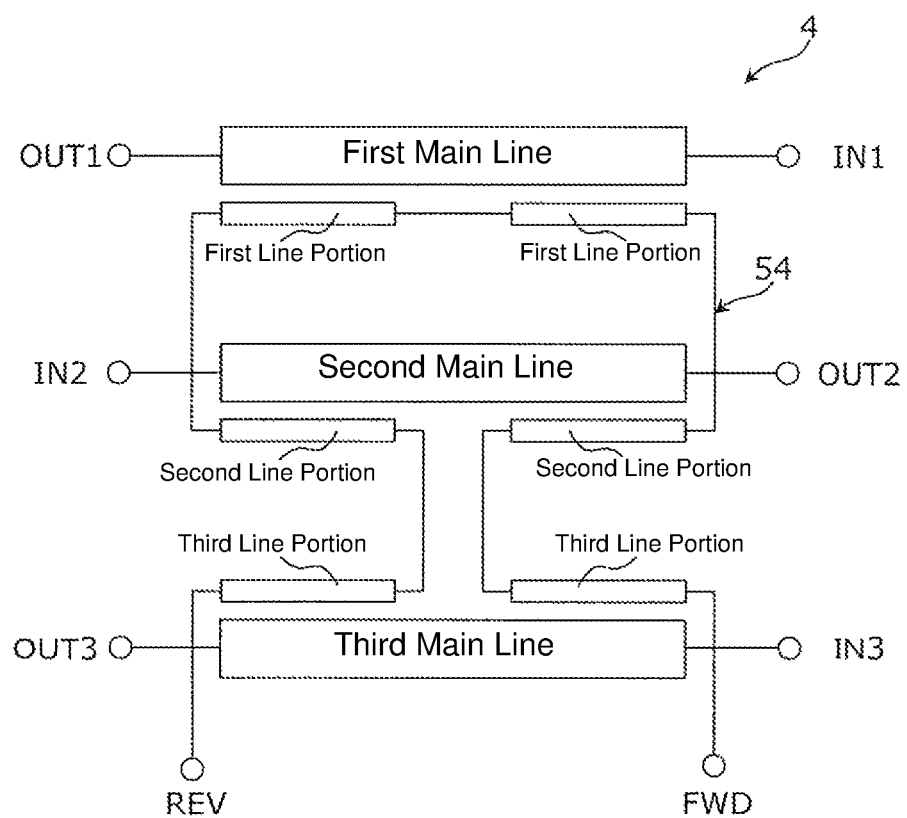
FIG. 10 is a circuit diagram that illustrates an example of an equivalent circuit of a bidirectional coupler according to a fourth embodiment.

FIG. 10 is a circuit diagram that illustrates an example of an equivalent circuit of a bidirectional coupler 4.

As illustrated in FIG. 10, the bidirectional coupler 4 includes a first main line 24, a second main line 34, a third main line 44, and a sub line 54.

A first end and a second end of the first main line 24 constitute an input port IN1 and an output port OUT1, a first end and a second end of the second main line 34 constitute an input port IN2 and an output port OUT2, and a first end and a second end of the third main line 44 constitute an input port IN3 and an output port OUT3. A first end and a second end of the sub line 54 constitute a forward port FWD and a reverse port REV.

The sub line 54 includes a pair of first line portions 541a and 541b, each coupled to the first main line 24, a pair of second line portions 542a and 542b, each to the second main line 34, and a pair of third line portions 543a and 543b, each coupled to the third main line 44.

The first line portion 541a is provided between the reverse port REV and the forward port FWD and the first line portion 541b is provided between the first line portion 541a and the forward port FWD. Hereinafter, the first line portions 541a and 541b may be collectively referred to as the first line portion 541.

The second line portion 542a is provided between the first line portion 541 of the sub line 54 and the reverse port REV and the second line portion 542b is provided between the first line portion 541 of the sub line 54 and the forward port FWD. The third line portion 543a is provided between the second line portion 542a of the sub line 54 and the reverse port REV and the third line portion 543b is provided between the second line portion 542b of the sub line 54 and the forward port FWD.

The pair of first line portions 541a and 541b are provided to extend in a direction approximately identical to the direction in which the first main line 24 extends, and the pair of second line portions 542a and 542b are provided to extend in a direction approximately identical to the direction in which the second main line 34 extends, and the pair of third line portions 543a and 543b are provided to extend in a direction approximately identical to the direction in which the third main line 44 extends.

Also in the bidirectional coupler 4, a portion of the sub line 54 coupled to the first main line 24 is constituted of the pair of first line portions 541a and 541b and on both sides of the coupled portion to the first main line 24, the second line portions 542a and 542b are provided, which constitute a portion of the sub line 54 coupled to the second main line 34. Thus, in the sub line 54, with the portion coupled to the first main line 24 (the first line portions 541a and 541b) positioned in the center, the portion coupled to the second main line 34 (the second line portions 542a and 542b) can be arranged substantially symmetrically.

Further in the bidirectional coupler 4, a portion of the sub line 54 coupled to the second main line 34 is constituted of the pair of second line portions 542a and 542b and on both sides of the coupled portion coupled to the second main line 34, the third line portions 543a and 543b are provided, which constitute a portion coupled to the third main line 44. Thus, in the sub line 54, with the portion coupled to the second main line 34 (the second line portions 542a and 542b) positioned in the center, the portion coupled to the third main line 44 (the third line portions 543a and 543b) can be arranged symmetrically.

By arranging the coupled portions as described above, electrical characteristics from the first main line 24 to the forward port FWD and the reverse port REV can be substantially equalized, electrical characteristics from the second main line 34 to the forward port FWD and the reverse port REV can be substantially equalized, and electrical characteristics from the third main line 44 to the forward port FWD and the reverse port REV can be substantially equalized.

Accordingly, a first monitor signal corresponding to a forward direction signal and a second monitor signal corresponding to a reverse direction signal can be respectively extracted from the forward port FWD and the reverse port REV, where electrical characteristics from the first main line 24, the second main line 34, and the third main line 44 are substantially equalized. As a result, the bidirectional coupler 4 can be obtained, where for all of the first main line 24, the second main line 34, the third main line 44, both the directivity relative to a forward direction signal and the directivity relative to a reverse direction signal are enhanced.

Features of a configuration of the bidirectional coupler 4 are described below.

Figure 11:
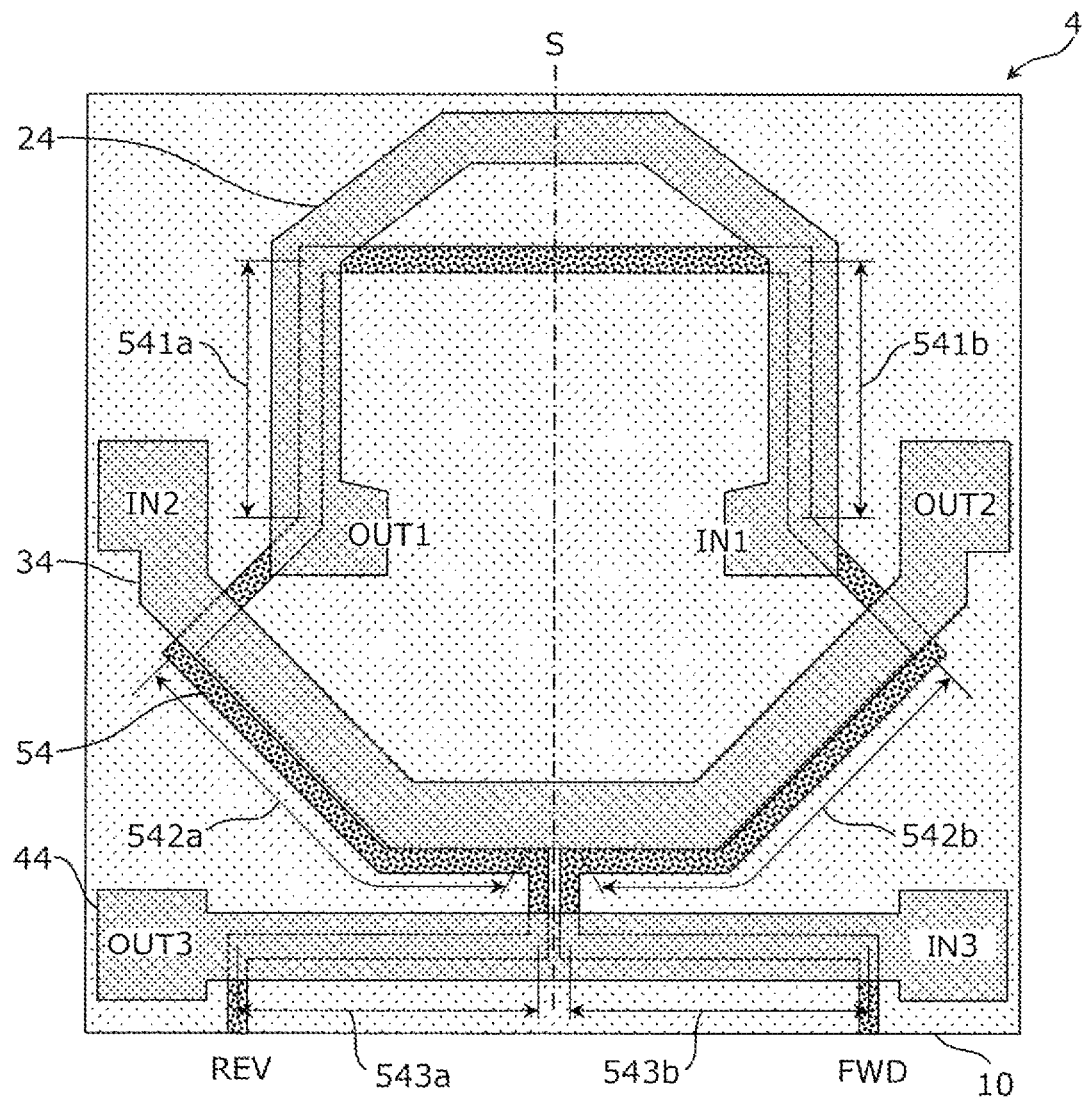
FIG. 11 is a plan view that illustrates an example of a configuration of the bidirectional coupler according to the fourth embodiment.

FIG. 11 is a plan view that illustrates an example of a configuration of the bidirectional coupler 4. The bidirectional coupler 4 in FIG. 11 is different from the bidirectional coupler 3 according to the third embodiment in the shape of the first main line 24.

As illustrated in FIG. 11, the first main line 24 and the second main line 34 are approximately formed like a substantially V-shaped (or U-shaped) nest with different opening angles, where the first main line 24 is arranged inside and the second main line 34 is arranged outside. Specifically, the first main line 24 is like a substantially reverse shape of the letter V (or U) and forms a nest-like configuration so that an opening of the first main line 24 and an opening of the second main line 34 face each other. The third main line 44 is formed on the side opposite the side on which the first main line 24 is positioned when viewed from the second main line 34. The third main line 44 is like a substantially straight line and has an opening angle of 180°. The sub line 54 is formed to have a track-like (or loop) shape of a single lap (or a single round) having no grade separated crossing. The sub line 54 runs from the forward port FWD in the track-like (or loop) shape along part of the third main line 44, part of the second main line 34, part of the first main line 24, part of the second main line 34, and part of the third main line 44 and reaches the reverse port REV.

As illustrated in FIG. 11, in the bidirectional coupler 4, the third line portion 543b provided to extend in a direction approximately identical to the direction in which the third main line 44 extends is present in a ⅙ lap section of the sub line 54 from the forward port FWD and the third line portion 543b is coupled to the half section of the third main line 44 on the side of the input port IN3. Further, the second line portion 542b provided to extend in a direction approximately identical to the direction in which the second main line 34 extends is present in a subsequent ⅙ lap section of the sub line 54 and the second line portion 542b is coupled to the half section of the second main line 34 on the side of the output port OUT2. Further, the first line portion 541b provided to extend in a direction approximately identical to the direction in which the first main line 24 extends is present in a subsequent ⅙ lap section of the sub line 54 and the first line portion 541b is coupled to a partial section of the first main line 24 on the side of the input port IN1.

Further, the first line portion 541a provided to extend in a direction approximately identical to the direction in which the first main line 24 extends is present in a subsequent ⅙ lap section of the sub line 54 and the first line portion 541a is coupled to another partial section of the first main line 24 on the side of the output port OUT1. Further, the second line portion 542a provided to extend in a direction approximately identical to the direction in which the second main line 34 extends is present in a subsequent ⅙ lap section of the sub line 54 and the second line portion 542a is coupled to the half section of the second main line 34 on the side of the input port IN2. Further, the third line portion 543a provided to extend in a direction approximately identical to the direction in which the third main line 44 extends is present in the remaining ⅙ lap section of the sub line 54 and the third line portion 543a is coupled to the half section of the third main line 44 on the side of the output port OUT3.

As illustrated in FIG. 11, in a first region and a second region on a multilayer board 10 with a straight line S positioned therebetween, the sub line 54 is provided to substantially have a shape of line symmetry with the straight line S serving as the axis of symmetry, and the first line portions 541a and 541b, the second line portions 542a and 542b, and the third line portions 543a and 543b are each at corresponding symmetrical positions about the line of symmetry. In other words, the sub line 54 is arranged in or on the multilayer board 10 in line symmetry with the line S (the line of symmetry) passing through the multilayer board 10 in a plan view, and the first line portions 541a and 541b, the second line portions 542a and 542b, and the third line portions 543a and 543b are each arranged on opposite sides of the line S and at corresponding symmetrical positions about the line of symmetry.

Accordingly, on the basis of the shape of the sub line 54 that is substantially symmetric, electrical characteristics from the first main line 24, the second main line 34, and the third main line 44 to the forward port FWD and the reverse port REV can be substantially equalized more accurately. As a result, the bidirectional coupler 4 can be obtained, where both the directivity relative to a forward direction signal and the directivity relative to a reverse direction signal are enhanced.

Fifth Embodiment

In a fifth embodiment, a variation of the sub line is described.

Figure 12:
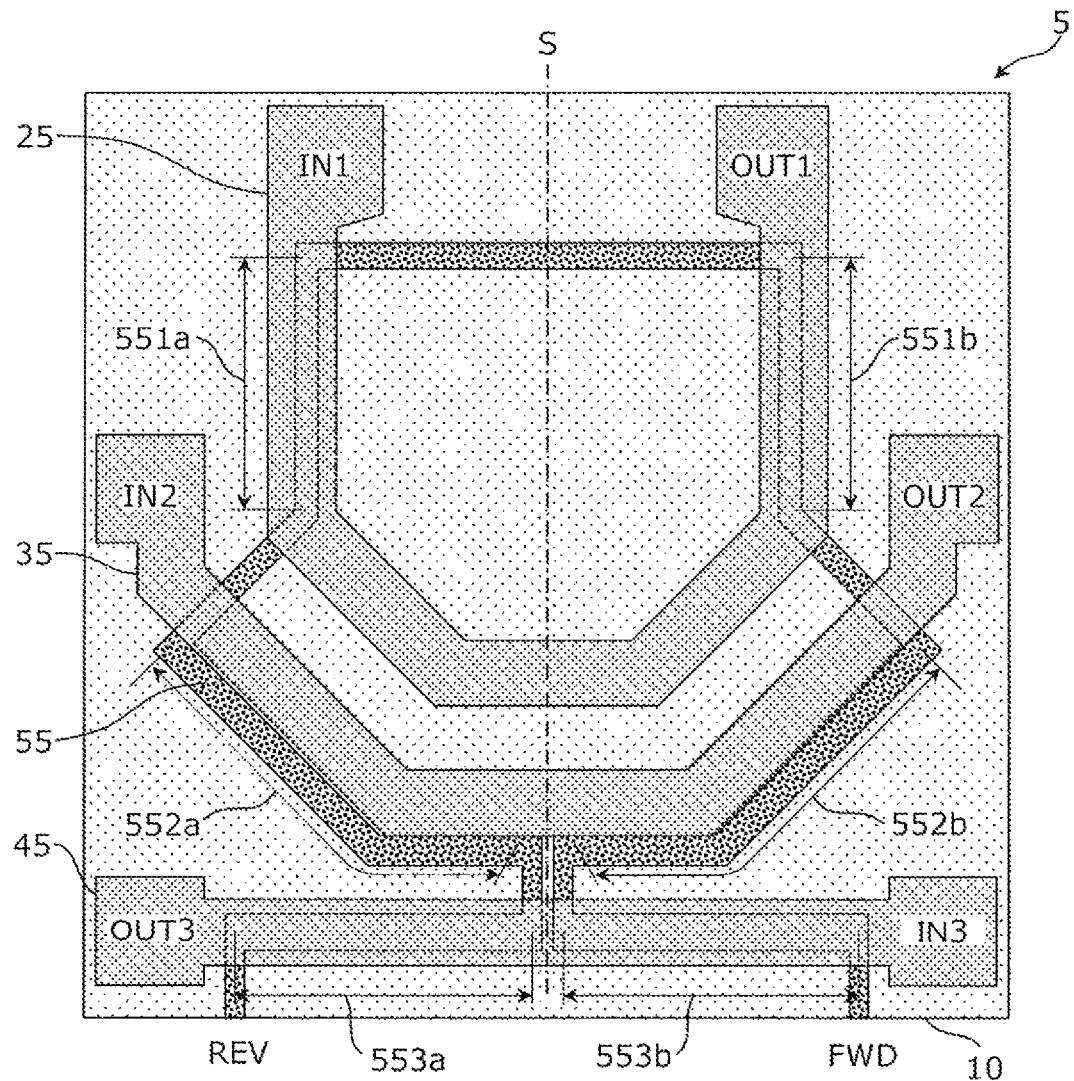
FIG. 12 is a plan view that illustrates an example of a configuration of the bidirectional coupler according to a fifth embodiment.

FIG. 12 is a plan view that illustrates an example of a configuration of a bidirectional coupler 5 according to the fifth embodiment. The bidirectional coupler 5 in FIG. 12 is different from the bidirectional coupler 3 according to the third embodiment in the shape of a sub line 55. Hereinafter, identical references are given to the constituent elements identical to those in the third embodiment and descriptions thereof are omitted where appropriate.

As illustrated in FIG. 12, in the bidirectional coupler 5, the width of the sub line 55, that is, the length in the direction that crosses the longitudinal direction is different in at least one of first line portions 551a and 551b, second line portions 552a and 552b, and third line portions 553a and 553b. In other words, a width of at least one of the first line portion (551a, 551b), the second line portion (552a, 552b), and the third line portion (553a, 553b) is different from a width of another of the first line portion, the second line portion, and the third line portion. In the example of FIG. 12, each width of the second line portions 552a and 552b is larger than each width of the first line portions 551a and 551b. Further, each width of the third line portions 553a and 553b is larger than each width of the second line portions 552a and 552b.

Thus, by setting the width of the sub line 55 for each coupled portion, coupling of the sub line 55 to each of the first main line 25, the second main line 35, and the third main line 45 can be optimized according to the width of the sub line 55. For example, depending on optimization conditions for coupling, in the converse manner of the example in FIG. 12, each width of the first line portions 551a and 551b may be larger than each width of the second line portions 552a and 552b. Further, each width of the second line portions 552a and 552b may be larger than each width of the third line portions 553a and 553b.

Sixth Embodiment

In a sixth embodiment, a variation of the sub line is described.

Figure 13:
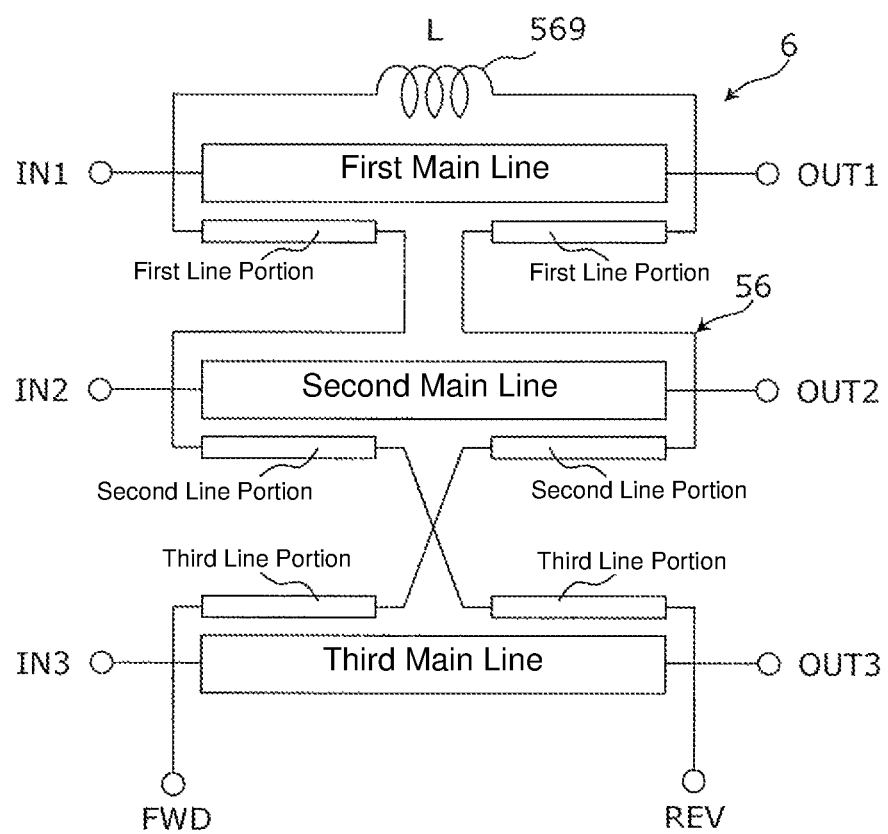
FIG. 13 is a circuit diagram that illustrates an example of an equivalent circuit of a bidirectional coupler according to a sixth embodiment.

FIG. 13 is a circuit diagram that illustrates an example of an equivalent circuit of a bidirectional coupler 6 according to a sixth embodiment. The bidirectional coupler 6 in FIG. 13 is different from the bidirectional coupler 1 in FIG. 1 in that an inductor L is inserted in a sub line 56. The insertion of the inductor L in series in a mid-point of the sub line 56 can increase the directivity of the bidirectional coupler 6.

The inductor L may be formed by for example, a wiring pattern.

Figure 14:
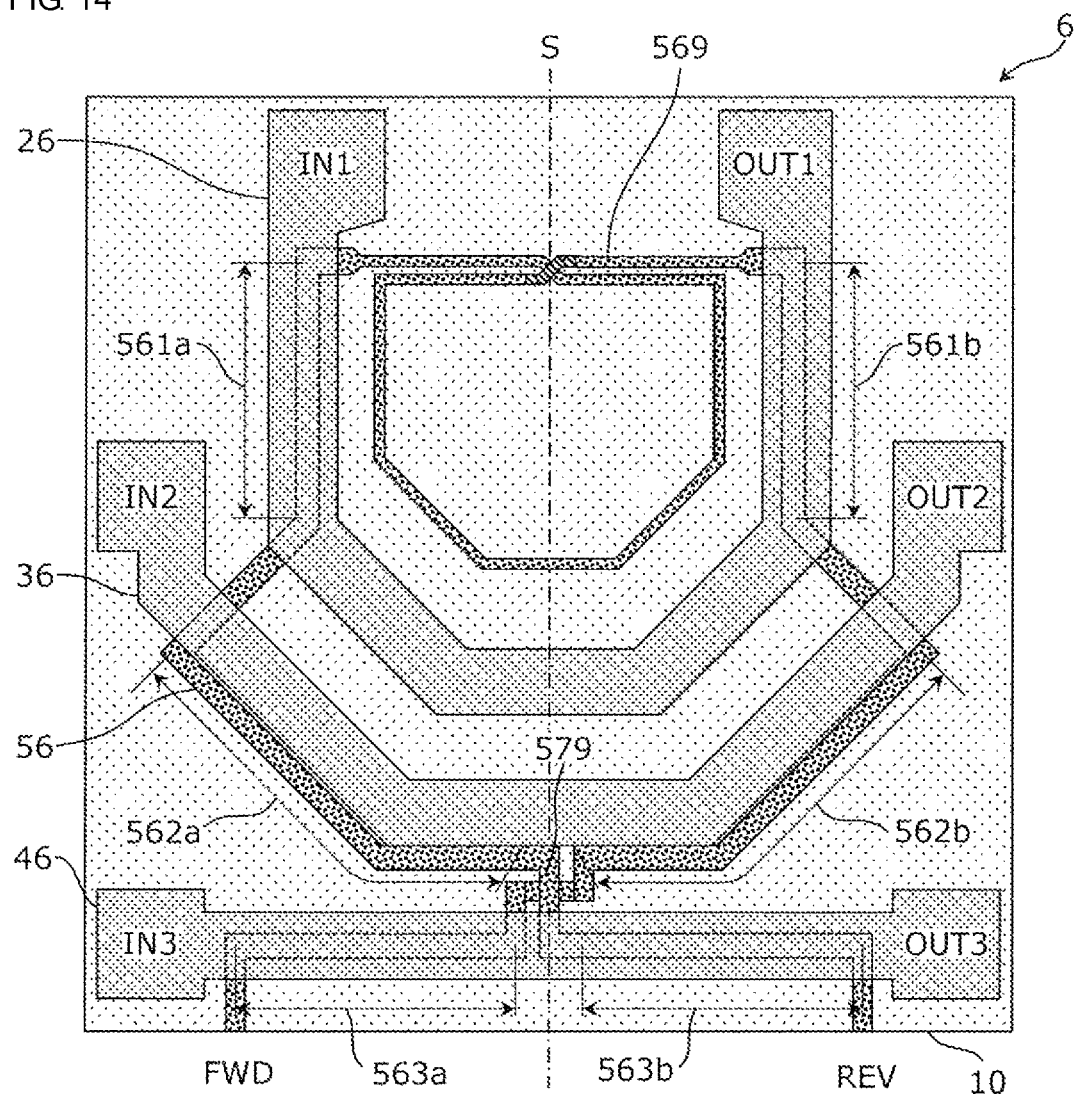
FIG. 14 is a plan view that illustrates an example of a configuration of the bidirectional coupler according to the sixth embodiment.

FIG. 14 is a plan view that illustrates an example of a configuration of the bidirectional coupler 6. As illustrated in FIG. 14, the sub line 56 of the bidirectional coupler 6 is constituted by adding a loop-like winding portion 569 that connects the first line portions 561a and 561b to each other to the sub line 51 of the bidirectional coupler 1 in FIG. 1.

The winding portion 569 functioning as the inductor L can increase the directivity of the bidirectional coupler 6.

Seventh Embodiment

In a seventh embodiment, a monitor circuit using a bidirectional coupler is described.

Figure 15:
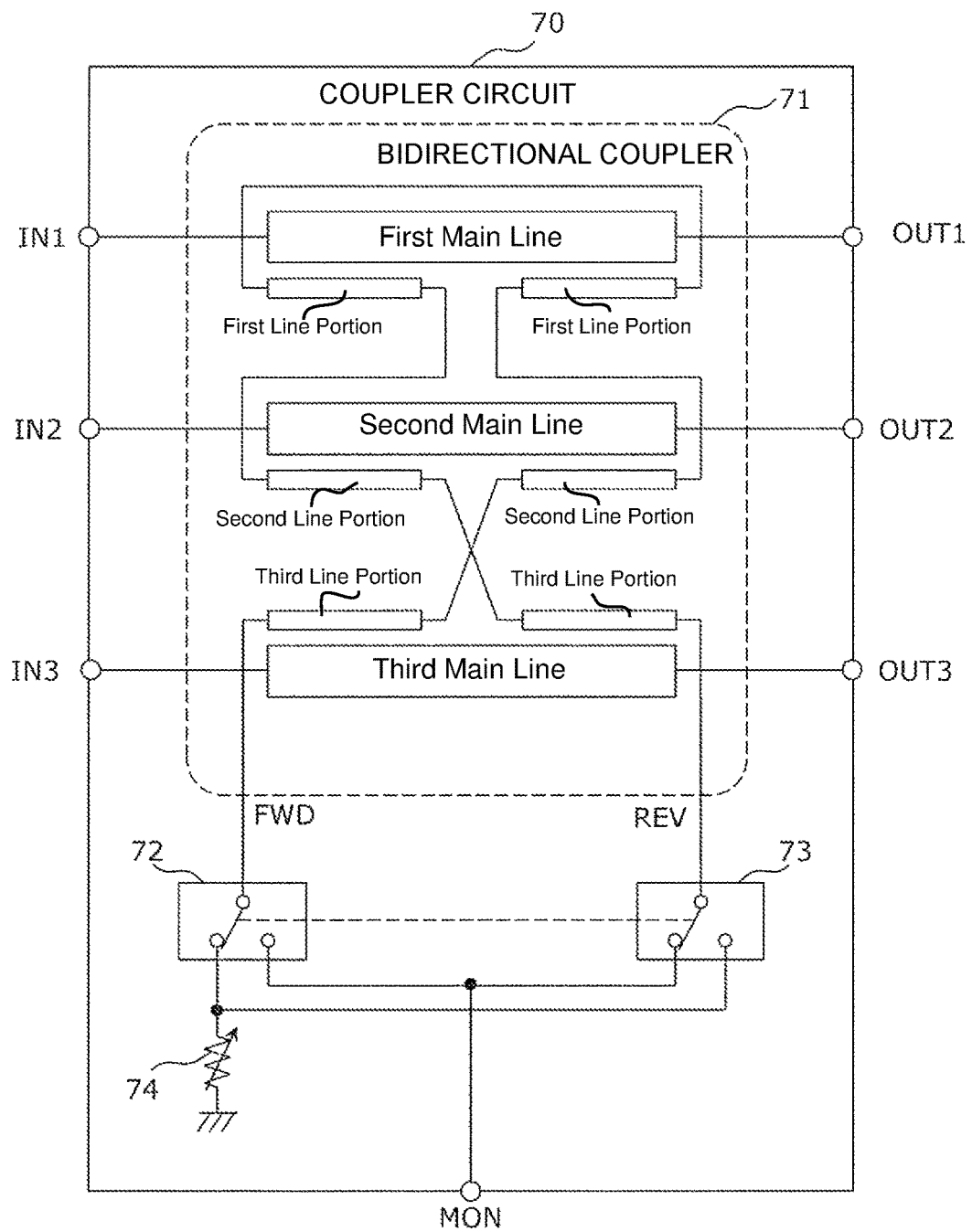
FIG. 15 is a circuit diagram that illustrates an example of a monitor circuit of a directional coupler according to a seventh embodiment.

FIG. 15 is a circuit diagram that illustrates an example of a monitor circuit 70 according to a seventh embodiment. The monitor circuit 70 in FIG. 15 includes a bidirectional coupler 71, switches 72 and 73, and a terminator 74.

As the bidirectional coupler 71, any one of the bidirectional couplers 1 to 6 described in the first to sixth embodiments is used.

The switches 72 and 73 are a pair of single-pole double-throw switches and cooperate in accordance with a control signal, which is not illustrated.

The terminator 74 is a variable complex impedance that can be varied in accordance with a control signal, which is not illustrated, and is constituted of for example, a variable resistor and a variable inductor.

In the monitor circuit 70 configured as described above, a desired one of a monitor signal extracted from a forward port FWD and a monitor signal extracted from a reverse port REV can be selected by the switches 72 and 73 to be undergone suitable termination by the terminator 74 and can be output as a monitor signal MON.

Eighth Embodiment

In an eighth embodiment, a communication device using the monitor circuit according to the seventh embodiment is described with an example of a communication device adaptable to a triple band, where transmission and reception operations can be performed using three different frequency bands.

Figure 16:
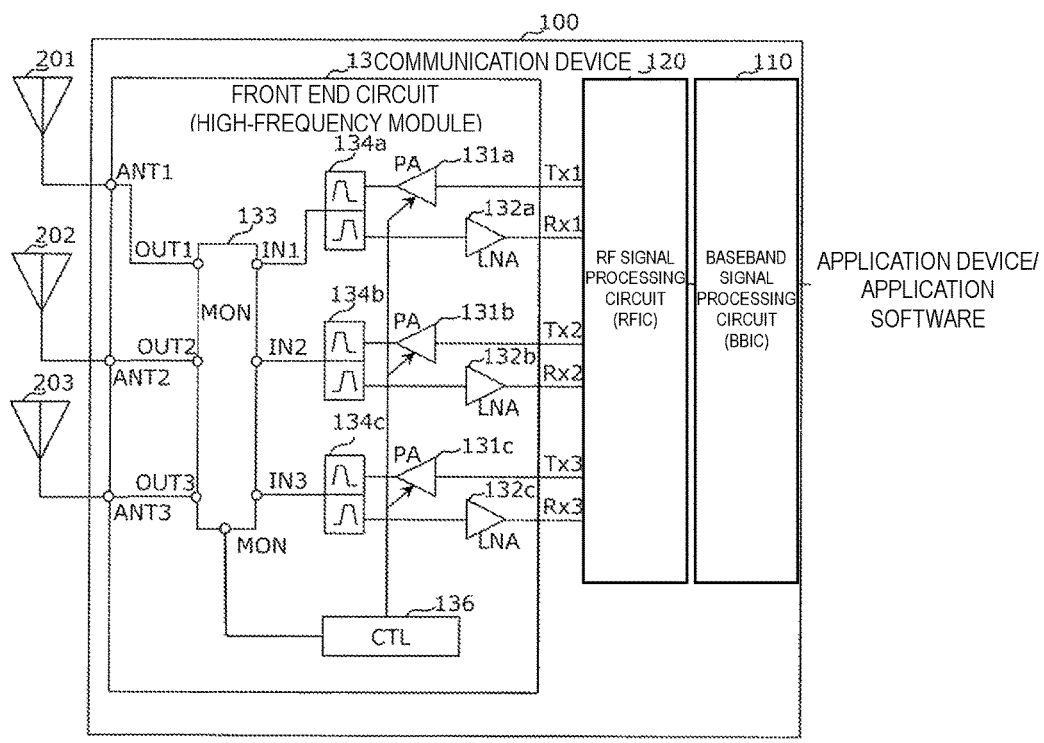
FIG. 16 is a block diagram that illustrates an example of a functional configuration of a communication device according to an eighth embodiment.

FIG. 16 is a block diagram that illustrates an example of a functional configuration of a communication device 100 according to the eighth embodiment. As illustrated in FIG. 16, the communication device 100 includes a baseband signal processing circuit 110, an RF signal processing circuit 120, and a front end circuit 130. The communication device 100 performs transmission and reception operations in a triple band using antennas 201, 202, and 203.

The baseband signal processing circuit 110 converts transmission data generated in an application device or application software, which performs a voice call, image display, or the like, into a transmission signal and supplies the transmission signal to the RF signal processing circuit 120. The conversion may include compression of data, multiplexing, and addition of an error correction code. Further, the baseband signal processing circuit 110 converts a reception signal received from the RF signal processing circuit 120 into reception data and supplies the reception data to the application device or application software. The conversion may include expansion of data, demultiplexing, and error correction. The baseband signal processing circuit 110 may be constituted by a baseband integrated circuit (BBIC) chip.

The RF signal processing circuit 120 converts a transmission signal generated in the baseband signal processing circuit 110 into transmission RF signals Tx1, Tx2, and Tx3 of respective frequency bands and supplies the transmission RF signals to the front end circuit 130. The conversion may include modulation and up-conversion of a signal. Further, the RF signal processing circuit 120 converts reception RF signals Rx1, Rx2, and Rx3 of respective frequency bands received from the front end circuit 130 into reception signals and supplies the reception signals to the baseband signal processing circuit 110. The RF signal processing circuit 120 may be constituted by a radio-frequency integrated circuit (RFIC) chip.

The front end circuit 130 includes power amplifier circuits 131a, 131b, and 131c, low noise amplifier circuits 132a, 132b, and 132c, a monitor circuit 133, duplexers 134a, 134b, and 134c, and a controller 136. Each of the duplexers 134a to 134c is constituted by a filter for each frequency band. The monitor circuit 133 is connected to the duplexers 134a to 134c and antenna terminals ANT1, ANT2, and ANT3.

The power amplifier circuits 131a to 131c amplify the transmission RF signals Tx1, Tx2, and Tx3 of respective frequency bands generated in the RF signal processing circuit 120 and supply the transmission RF signals to the monitor circuit 133 through the duplexers 134a to 134c. The amplification gain and matched impedance in the power amplifier circuits 131a to 131c are variable and are adjusted according to the control from the controller 136.

The duplexers 134a to 134c combine the transmission RF signals Tx1, Tx2, and Tx3 of respective frequency bands received from the power amplifier circuits 131a to 131c with the transmission antenna signal Tx and supply the resultant signals to respective ports IN1, IN2, and IN3 of the monitor circuit 133.

The monitor circuit 133 causes a transmission antenna signal Tx to propagate from ports OUT1, OUT2, and OUT3 to the respective antennas 201, 202, and 203 through the respective antenna terminals ANT1, ANT2, and ANT3 and outputs a monitor signal MON that indicates the intensity of the transmission antenna signal Tx and the intensities of the reflected waves of the transmission antenna signal Tx from the antennas 201, 202, and 203.

The monitor circuit 133 receives a reception antenna signal Rx from the antennas 201, 202, and 203 at the respective ports OUT1, OUT2, and OUT3 with the antenna terminals ANT1, ANT2, and ANT3 interposed therebetween and causes the reception antenna signal Rx to propagate from the respective ports IN1, IN2, and IN3 to the respective duplexers 134a to 134c.

The monitor circuit 70 according to the seventh embodiment is used as the monitor circuit 133.

The duplexers 134a to 134c cause the reception RF signals Rx1, Rx2, and Rx3 of respective frequency bands to be separated from the reception antenna signal Rx and supply the resultant signals to the low noise amplifier circuits 132a to 132c.

The low noise amplifier circuit 132a to 132c amplify the reception RF signals Rx1, Rx2, and Rx3 of respective frequency bands received from the respective duplexers 134a to 134c and supply the resultant signals to the RF signal processing circuit 120.

The controller 136 performs feedback control of transmission power and matching adjustment for the antennas 201, 202, and 203 by controlling the amplification gain and matched impedance of the power amplifier circuits 131a to 131c in accordance with the monitor signal MON received from the monitor circuit 133.

The front end circuit 130 may be constituted of the power amplifier circuits 131a to 131c, the low noise amplifier circuits 132a to 132c, the monitor circuit 133, the duplexers 134a to 134c, and a high-frequency module where the controller 136 is mounted. The controller 136 may be included in the RF signal processing circuit 120 instead of being included in the front end circuit 130.

Since in the communication device 100, the monitor circuit 133 employs a bidirectional coupler favorable in both the directivity relative to a forward direction signal (a transmission signal) and the directivity relative to a reverse direction signal (a reflected wave), a high-performance communication device that performs various kinds of control with high accuracy can be configured, which includes the feedback control of transmission power and the matching adjustment for an antenna.

Although the bidirectional coupler, the monitor circuit, and the front end circuit according to the embodiments of the present disclosure are described above, the present disclosure is not limited to each individual embodiment. As long as the spirit of the present disclosure is not departed, an embodiment where various changes that those skilled in the art can conceive are added to the present embodiments or an embodiment formulated by combining constituent elements in different embodiments may also be included in the scope of one or more aspects of the present disclosure.

Figure 17:
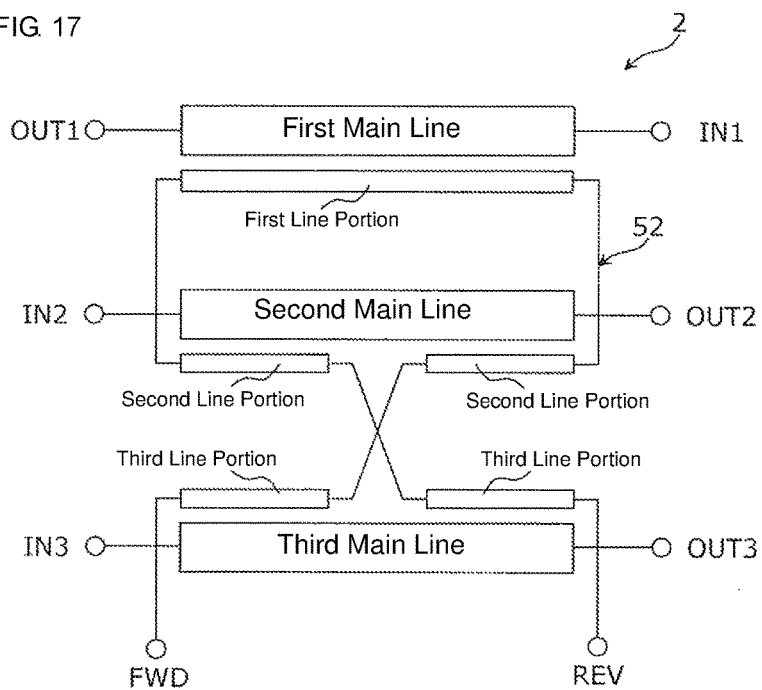
FIG. 17 is a circuit diagram that illustrates an example of an equivalent circuit of a bidirectional coupler according to another embodiment.

For example, in the bidirectional coupler 2 according to the second embodiment, a single first line portion 521 may constitute the first line portions 521a and 521b as illustrated in FIG. 17 instead of two lines. The similar applies to the other embodiments, which are the first embodiment and the third to sixth embodiments.

The present disclosure can be widely utilized for bidirectional couplers and communication devices that use bidirectional couplers.

While embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A bidirectional coupler comprising:
a multilayer board; and
a first main line, a second main line, a third main line, and a sub line that are provided in or on the multilayer board, wherein:
the sub line comprises:
a first line portion that is electromagnetically coupled to the first main line,
an even number of second line portions that are electromagnetically coupled to the second main line, and
an even number of third line portions that are electromagnetically coupled to the third main line,
a first half of the even number of second line portions are provided between the first line portion and a first end of the sub line, and a second half of the even number of second line portions are provided between the first line portion and a second end of the sub line,
a first half of the even number of third line portions are provided between the first half of the second line portions and the first end of the sub line, and a second half of the even number of third line portions are provided between the second half of the second line portions and the second end of the sub line.

2. The bidirectional coupler according to claim 1, wherein the first line portion comprises a pair of first line portions.

3. The bidirectional coupler according to claim 2, wherein an electrical length between a mid-point of the sub line and one of the pair of first line portions is approximately equal to an electrical length between the mid-point and another of the pair of first line portions.

4. The bidirectional coupler according to claim 1, wherein:
the even number of second line portions comprise a pair of second line portions, and
an electrical length between a mid-point of the sub line and one of the pair of second line portions is approximately equal to an electrical length between the mid-point and another of the pair of second line portions.

5. The bidirectional coupler according to claim 1, wherein:
the even number of third line portions comprise a pair of third line portions, and
an electrical length between a mid-point of the sub line and one of the pair of third line portions is approximately equal to an electrical length between the mid-point and another of the pair of third line portions.

6. The bidirectional coupler according to claim 1, wherein:
the even number of second line portions comprise a pair of second line portions, and
the sub line is arranged in or on the multilayer board in line symmetry with a line of symmetry passing through the multilayer board in a plan view, each of the pair of second line portions being arranged on opposite sides of the line of symmetry and at corresponding symmetrical positions about the line of symmetry.

7. The bidirectional coupler according to claim 1, wherein:
the even number of third line portions comprise a pair of third line portions, and
the sub line is arranged in or on the multilayer board in line symmetry with a line of symmetry passing through the multilayer board in a plan view, each of the pair of third line portions being arranged on opposite sides of the line of symmetry and at corresponding symmetrical positions about the line of symmetry.

8. The bidirectional coupler according to claim 2, wherein the sub line is arranged in or on the multilayer board in line symmetry with a line of symmetry passing through the multilayer board in a plan view, each of the pair of first line portions being arranged on opposite sides of the line of symmetry and at corresponding symmetrical positions about the line of symmetry.

9. The bidirectional coupler according to claim 2, wherein each of the pair of first line portions are connected to each other by an inductor.

10. The bidirectional coupler according to claim 1, wherein a width of at least one of the first line portion, the second line portion, and the third line portion is different from a width of another of the first line portion, the second line portion, and the third line portion.

11. A monitor circuit comprising the bidirectional coupler according to claim 1.

12. A front end circuit comprising:
the monitor circuit according to claim 11;
an antenna terminal connected to the monitor circuit; and
a filter connected to the monitor circuit.

13. The bidirectional coupler according to claim 2, wherein:
the even number of second line portions comprise a pair of second line portions, and
an electrical length between a mid-point of the sub line and one of the pair of second line portions is approximately equal to an electrical length between the mid-point and another of the pair of second line portions.

14. The bidirectional coupler according to claim 3, wherein:
the even number of second line portions comprise a pair of second line portions, and
an electrical length between a mid-point of the sub line and one of the pair of second line portions is approximately equal to an electrical length between the mid-point and another of the pair of second line portions.

15. The bidirectional coupler according to claim 2, wherein:
the even number of third line portions comprise a pair of third line portions, and an electrical length between a mid-point of the sub line and one of the pair of third line portions is approximately equal to an electrical length between the mid-point and another of the pair of third line portions.

16. The bidirectional coupler according to claim 2, wherein:
the even number of second line portions comprise a pair of second line portions, and
the sub line is arranged in or on the multilayer board in line symmetry with a line of symmetry passing through the multilayer board in a plan view, each of the pair of second line portions being arranged on opposite sides of the line of symmetry and at corresponding symmetrical positions about the line of symmetry.

17. The bidirectional coupler according to claim 2, wherein:
the even number of third line portions comprise a pair of third line portions, and
the sub line is arranged in or on the multilayer board in line symmetry with a line of symmetry passing through the multilayer board in a plan view, each of the pair of third line portions being arranged on opposite sides of the line of symmetry and at corresponding symmetrical positions about the line of symmetry.

18. The bidirectional coupler according to claim 3, wherein the sub line is arranged in or on the multilayer board in line symmetry with a line of symmetry passing through the multilayer board in a plan view, each of the pair of first line portions being arranged on opposite sides of the line of symmetry and at corresponding symmetrical positions about the line of symmetry.

19. The bidirectional coupler according to claim 3, wherein each of the pair of first line portions are connected to each other by an inductor.

20. The bidirectional coupler according to claim 2, wherein a width of at least one of the first line portion, the second line portion, and the third line portion is different from a width of another of the first line portion, the second line portion, and the third line portion.

* * * * *